United States Patent
Chen et al.

(10) Patent No.: US 10,134,978 B2
(45) Date of Patent: *Nov. 20, 2018

(54) MAGNETIC CELL STRUCTURES, AND METHODS OF FABRICATION

(71) Applicant: Micron Technology, Inc., Boise, ID (US)

(72) Inventors: Wei Chen, White Plains, NY (US); Jonathan D. Harms, White Plains, NY (US); Sunil Murthy, White Plains, NY (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/667,364

(22) Filed: Aug. 2, 2017

(65) Prior Publication Data

US 2017/0358737 A1 Dec. 14, 2017

Related U.S. Application Data

(63) Continuation of application No. 14/558,367, filed on Dec. 2, 2014, now Pat. No. 9,768,377.

(51) Int. Cl.
  *H01L 43/02* (2006.01)
  *H01L 43/08* (2006.01)
  (Continued)

(52) U.S. Cl.
  CPC ............ *H01L 43/08* (2013.01); *G11C 11/161* (2013.01); *H01L 43/12* (2013.01); *H01L 27/228* (2013.01)

(58) Field of Classification Search
  CPC ........ H01L 43/02; H01L 43/12; H01L 27/222
  See application file for complete search history.

(56) References Cited

U.S. PATENT DOCUMENTS 4,882,936 A 11/1989 Garshelis
5,551,586 A 9/1996 Uenoyama et al.
(Continued)

FOREIGN PATENT DOCUMENTS

CN 101162756 A 4/2008
CN 101395732 A 3/2009
(Continued)

OTHER PUBLICATIONS

Machine translation, Yoshikawa, Japanese Pat. Pub. No. JP 2008-10590, translation date: Nov. 18, 2016, Espacenet, all pages.*
(Continued)

*Primary Examiner* — Victoria K Hall
(74) *Attorney, Agent, or Firm* — TraskBritt

(57) ABSTRACT

A magnetic cell structure comprises a seed material including tantalum, platinum, and ruthenium. The seed material comprises a platinum portion overlying a tantalum portion, and a ruthenium portion overlying the platinum portion. The magnetic cell structure comprises a magnetic region overlying the seed material, an insulating material overlying the magnetic region, and another magnetic region overlying the insulating material. Semiconductor devices including the magnetic cell structure, methods of forming the magnetic cell structure and the semiconductor devices are also disclosed.

16 Claims, 12 Drawing Sheets

(51) Int. Cl.
  *H01L 43/12* (2006.01)
  *G11C 11/16* (2006.01)
  *H01L 27/22* (2006.01)

(56) References Cited

U.S. PATENT DOCUMENTS

| | | | |
|---|---|---|---|
| 5,563,000 A | 10/1996 | Tukaram et al. | |
| 5,565,266 A | 10/1996 | Hatwar et al. | |
| 5,583,725 A | 12/1996 | Coffey et al. | |
| 5,604,030 A | 2/1997 | Yamane et al. | |
| 5,768,069 A | 6/1998 | Mauri | |
| 6,166,948 A | 12/2000 | Parkin et al. | |
| 6,258,470 B1 | 7/2001 | Sakakima et al. | |
| 6,275,363 B1 | 8/2001 | Gill | |
| 6,347,049 B1 | 2/2002 | Childress et al. | |
| 6,363,000 B2 | 3/2002 | Perner et al. | |
| 6,387,476 B1 | 5/2002 | Iwasaki et al. | |
| 6,483,741 B1 | 11/2002 | Iwasaki et al. | |
| 6,560,135 B2 | 5/2003 | Matsuoka et al. | |
| 6,569,545 B1 | 5/2003 | Tetsuya et al. | |
| 6,611,405 B1 | 8/2003 | Inomata et al. | |
| 6,653,704 B1 | 11/2003 | Gurney et al. | |
| 6,703,249 B2 | 3/2004 | Okazawa et al. | |
| 6,771,534 B2 | 8/2004 | Stipe | |
| 6,806,096 B1 | 10/2004 | Kim et al. | |
| 6,845,038 B1 | 1/2005 | Shukh | |
| 6,955,857 B2 | 10/2005 | Kubota et al. | |
| 6,964,819 B1 | 11/2005 | Girt et al. | |
| 6,970,376 B1 | 11/2005 | Fukuzumi | |
| 6,980,468 B1 | 12/2005 | Ounadjela | |
| 6,992,359 B2 | 1/2006 | Nguyen et al. | |
| 6,998,150 B2 | 2/2006 | Li et al. | |
| 7,026,671 B2 | 4/2006 | Mizuguchi et al. | |
| 7,095,933 B2 | 8/2006 | Barth | |
| 7,130,167 B2 | 10/2006 | Gill | |
| 7,189,583 B2 | 3/2007 | Drewes | |
| 7,230,265 B2 | 6/2007 | Kaiser et al. | |
| 7,239,489 B2 | 7/2007 | Lin et al. | |
| 7,274,080 B1 | 9/2007 | Parkin | |
| 7,329,280 B2 | 2/2008 | Bolling et al. | |
| 7,372,674 B2 | 5/2008 | Gill | |
| 7,378,698 B2 | 5/2008 | Ha et al. | |
| 7,379,280 B2 | 5/2008 | Fukumoto et al. | |
| 7,486,552 B2 | 2/2009 | Apalkov et al. | |
| 7,488,609 B1 | 2/2009 | Lin et al. | |
| 7,514,160 B2 | 4/2009 | Nagahama et al. | |
| 7,563,486 B2 | 7/2009 | Barth | |
| 7,564,152 B1 | 7/2009 | Clark et al. | |
| 7,602,033 B2 | 10/2009 | Zhao et al. | |
| 7,660,153 B2 | 2/2010 | Yamane et al. | |
| 7,682,841 B2 | 3/2010 | Dahmani et al. | |
| 7,732,881 B2 | 6/2010 | Wang | |
| 7,750,421 B2 | 7/2010 | Horng et al. | |
| 7,791,844 B2 | 9/2010 | Carey et al. | |
| 7,835,173 B2 | 11/2010 | Ma et al. | |
| 7,863,060 B2 | 1/2011 | Belen et al. | |
| 7,885,105 B2 | 2/2011 | Li et al. | |
| 7,919,794 B2 | 4/2011 | Gu et al. | |
| 7,929,370 B2 | 4/2011 | Min | |
| 7,932,572 B2 | 4/2011 | Tsujiuchi | |
| 7,948,044 B2 | 5/2011 | Horng et al. | |
| 8,009,465 B2 | 8/2011 | Nakayama et al. | |
| 8,043,732 B2 | 10/2011 | Anderson et al. | |
| 8,048,492 B2 | 11/2011 | Fukuzawa et al. | |
| 8,068,317 B2 | 11/2011 | Gill | |
| 8,080,432 B2 | 12/2011 | Horng et al. | |
| 8,089,137 B2 | 1/2012 | Lung et al. | |
| 8,102,700 B2 | 1/2012 | Liu et al. | |
| 8,120,949 B2 | 2/2012 | Ranjan et al. | |
| 8,138,561 B2 | 3/2012 | Horng et al. | |
| 8,223,539 B2 | 7/2012 | Smythe et al. | |
| 8,324,697 B2 | 12/2012 | Worledge | |
| 8,334,148 B2 | 12/2012 | Jeong et al. | |
| 8,338,004 B2 | 12/2012 | Shin et al. | |
| 8,357,962 B2 | 1/2013 | Marukame et al. | |
| 8,385,107 B2 | 2/2013 | Prejbeanu | |
| 8,411,498 B2 | 4/2013 | Kim et al. | |
| 8,422,286 B2 | 4/2013 | Ranjan et al. | |
| 8,470,462 B2 | 6/2013 | Horng et al. | |
| 8,487,390 B2 | 7/2013 | Dimitrov et al. | |
| 8,492,169 B2 | 7/2013 | Cao et al. | |
| 8,514,527 B2 | 8/2013 | Komagaki et al. | |
| 8,545,999 B1 | 10/2013 | Leng et al. | |
| 8,570,798 B2 | 10/2013 | Meade et al. | |
| 8,587,043 B2 | 11/2013 | Natori et al. | |
| 8,604,573 B2 | 12/2013 | Yamakawa et al. | |
| 8,623,452 B2 | 1/2014 | Zhou | |
| 8,692,342 B2 | 4/2014 | Oh et al. | |
| 8,704,320 B2 | 4/2014 | Zhu et al. | |
| 8,749,003 B2 | 6/2014 | Horng et al. | |
| 8,766,341 B2 | 7/2014 | Han et al. | |
| 8,779,538 B2 | 7/2014 | Chen et al. | |
| 8,790,798 B2 | 7/2014 | Shukh | |
| 8,803,265 B2 | 8/2014 | Lim et al. | |
| 8,812,803 B2 | 8/2014 | Tsuchiya et al. | |
| 8,823,118 B2 | 9/2014 | Horng et al. | |
| 8,854,876 B2 | 10/2014 | Uchida et al. | |
| 8,923,038 B2 | 12/2014 | Kula et al. | |
| 9,269,888 B2 | 2/2016 | Meade et al. | |
| 9,373,780 B2 | 6/2016 | Jan et al. | |
| 9,466,789 B2 | 10/2016 | Wang et al. | |
| 9,472,752 B2 | 10/2016 | Wang et al. | |
| 9,659,592 B2 | 5/2017 | Ataka et al. | |
| 2001/0024853 A1 | 9/2001 | Wallace et al. | |
| 2002/0089874 A1 | 7/2002 | Nickel et al. | |
| 2002/0097534 A1 | 7/2002 | Sun et al. | |
| 2002/0105827 A1 | 8/2002 | Redon et al. | |
| 2002/0114112 A1 | 8/2002 | Nakashio et al. | |
| 2003/0011939 A1 | 1/2003 | Gill | |
| 2003/0030434 A1 | 2/2003 | Hasegawa et al. | |
| 2003/0035255 A1 | 2/2003 | Hasegawa et al. | |
| 2003/0063415 A1 | 4/2003 | Hasegawa et al. | |
| 2003/0064569 A1 | 4/2003 | Takayama et al. | |
| 2003/0103371 A1 | 6/2003 | Kim et al. | |
| 2003/0199104 A1 | 10/2003 | Leuschner et al. | |
| 2004/0008455 A1 | 1/2004 | Hasegawa et al. | |
| 2004/0075959 A1 | 4/2004 | Gill | |
| 2004/0091744 A1 | 5/2004 | Carey et al. | |
| 2004/0144995 A1 | 7/2004 | Nagahama et al. | |
| 2004/0174740 A1 | 9/2004 | Lee et al. | |
| 2004/0224243 A1 | 11/2004 | Yoshizawa et al. | |
| 2004/0233760 A1 | 11/2004 | Guo et al. | |
| 2004/0246776 A1 | 12/2004 | Covington | |
| 2005/0019608 A1 | 1/2005 | Kim et al. | |
| 2005/0024786 A1 | 2/2005 | Gill et al. | |
| 2005/0036361 A1 | 2/2005 | Fukuzumi | |
| 2005/0068683 A1 | 3/2005 | Gill | |
| 2005/0087511 A1 | 4/2005 | Sharma et al. | |
| 2005/0106810 A1 | 5/2005 | Pakala et al. | |
| 2005/0164414 A1 | 7/2005 | Deak | |
| 2005/0173698 A1 | 8/2005 | Drewes | |
| 2005/0189574 A1 | 9/2005 | Nguyen et al. | |
| 2005/0211973 A1 | 9/2005 | Mori et al. | |
| 2005/0230743 A1 | 10/2005 | Nakagawa et al. | |
| 2005/0231853 A1 | 10/2005 | Li et al. | |
| 2005/0233174 A1 | 10/2005 | Munteanu et al. | |
| 2005/0276099 A1 | 12/2005 | Horng et al. | |
| 2006/0002039 A1 | 1/2006 | Hasegawa et al. | |
| 2006/0038213 A1 | 2/2006 | Mori et al. | |
| 2006/0042930 A1 | 3/2006 | Mauri | |
| 2006/0098354 A1 | 5/2006 | Parkin | |
| 2006/0114714 A1 | 6/2006 | Kanegae | |
| 2006/0118842 A1 | 6/2006 | Iwata | |
| 2006/0261425 A1 | 11/2006 | Suemitsu et al. | |
| 2007/0008661 A1 | 1/2007 | Min et al. | |
| 2007/0026260 A1* | 2/2007 | Nemoto | G11B 5/7325 428/831 |
| 2007/0026263 A1 | 2/2007 | Kubota et al. | |
| 2007/0035890 A1 | 2/2007 | Sbiaa | |
| 2007/0053112 A1 | 3/2007 | Papworth Parkin | |
| 2007/0086121 A1 | 4/2007 | Nagase et al. | |
| 2007/0132003 A1 | 6/2007 | Takashima et al. | |
| 2007/0201265 A1 | 8/2007 | Ranjan et al. | |
| 2007/0217071 A1 | 9/2007 | Inamura et al. | |

(56) References Cited

U.S. PATENT DOCUMENTS

| | | |
|---|---|---|
| 2007/0247756 A1* | 10/2007 | Lai .................... G11B 5/667 360/131 |
| 2007/0253116 A1 | 11/2007 | Takahashi |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0170329 A1 | 7/2008 | Thangaraj et al. |
| 2008/0179699 A1 | 7/2008 | Horng et al. |
| 2008/0182131 A1 | 7/2008 | Iwasaki |
| 2008/0198512 A1* | 8/2008 | Mukai ................ G11B 5/7325 360/313 |
| 2008/0205130 A1 | 8/2008 | Sun et al. |
| 2008/0225581 A1 | 9/2008 | Yamane et al. |
| 2008/0242088 A1 | 10/2008 | Suzuki |
| 2008/0253039 A1 | 10/2008 | Nagamine et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0168238 A1 | 7/2009 | Kim et al. |
| 2009/0180215 A1 | 7/2009 | Ishikawa et al. |
| 2009/0190262 A1 | 7/2009 | Murakami et al. |
| 2009/0195924 A1 | 8/2009 | Nemoto et al. |
| 2009/0218645 A1 | 9/2009 | Ranjan et al. |
| 2009/0229111 A1 | 9/2009 | Zhao et al. |
| 2009/0231909 A1 | 9/2009 | Dieny et al. |
| 2009/0250776 A1 | 10/2009 | Takenaga et al. |
| 2009/0251829 A1 | 10/2009 | Zhang et al. |
| 2009/0256220 A1 | 10/2009 | Horng et al. |
| 2009/0257151 A1 | 10/2009 | Zhang et al. |
| 2010/0034014 A1 | 2/2010 | Ohno et al. |
| 2010/0035085 A1 | 2/2010 | Jung et al. |
| 2010/0080036 A1 | 4/2010 | Liu et al. |
| 2010/0080048 A1 | 4/2010 | Liu et al. |
| 2010/0086809 A1 | 4/2010 | Kuboki |
| 2010/0096716 A1 | 4/2010 | Ranjan et al. |
| 2010/0102406 A1 | 4/2010 | Xi et al. |
| 2010/0109110 A1 | 5/2010 | Wang et al. |
| 2010/0109111 A1 | 5/2010 | Shin et al. |
| 2010/0110783 A1 | 5/2010 | Liu et al. |
| 2010/0140726 A1 | 6/2010 | Apalkov et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0219491 A1 | 9/2010 | Lee et al. |
| 2010/0220516 A1 | 9/2010 | Lee et al. |
| 2010/0230769 A1 | 9/2010 | Ozaki et al. |
| 2010/0240151 A1 | 9/2010 | Belen et al. |
| 2010/0276771 A1 | 11/2010 | Fukumoto et al. |
| 2010/0327248 A1 | 12/2010 | Khoueir et al. |
| 2010/0328822 A1 | 12/2010 | Park et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Walls et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0086439 A1 | 4/2011 | Choi |
| 2011/0096443 A1 | 4/2011 | Zhang et al. |
| 2011/0121366 A1 | 5/2011 | Or-Bach et al. |
| 2011/0134563 A1 | 6/2011 | Komagaki et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0151280 A1 | 6/2011 | Takahashi et al. |
| 2011/0170339 A1 | 7/2011 | Wunderlich et al. |
| 2011/0170341 A1 | 7/2011 | Butler |
| 2011/0194329 A1 | 8/2011 | Ohba et al. |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0298456 A1 | 12/2011 | Lu et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0018824 A1* | 1/2012 | Lim ..................... H01L 27/228 257/421 |
| 2012/0018825 A1 | 1/2012 | Lim et al. |
| 2012/0023386 A1 | 1/2012 | Oh et al. |
| 2012/0040207 A1 | 2/2012 | Horng et al. |
| 2012/0061781 A1 | 3/2012 | Ohmori et al. |
| 2012/0068139 A1 | 3/2012 | Daibou et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0112297 A1* | 5/2012 | Yamakawa .......... H01L 27/228 257/421 |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0164485 A1 | 6/2012 | Lin |
| 2012/0181537 A1 | 7/2012 | Cao et al. |
| 2012/0205758 A1 | 8/2012 | Jan et al. |
| 2012/0217594 A1 | 8/2012 | Kajiyama |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0241879 A1* | 9/2012 | Ikeno .................. H01L 27/228 257/421 |
| 2012/0261777 A1 | 10/2012 | Shukh |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2013/0005052 A1 | 1/2013 | Hu et al. |
| 2013/0015539 A1 | 1/2013 | Choi |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0043471 A1 | 2/2013 | Cao et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0075839 A1 | 3/2013 | Chen et al. |
| 2013/0134534 A1 | 5/2013 | Sbiaa et al. |
| 2013/0140658 A1 | 6/2013 | Yamane et al. |
| 2013/0146996 A1 | 6/2013 | Yu et al. |
| 2013/0148418 A1* | 6/2013 | Luo .................... G11C 11/1675 365/158 |
| 2013/0154038 A1 | 6/2013 | Horng et al. |
| 2013/0177781 A1 | 7/2013 | Chepulskyy et al. |
| 2013/0209836 A1 | 8/2013 | Ataka et al. |
| 2013/0221459 A1 | 8/2013 | Jan et al. |
| 2013/0224521 A1 | 8/2013 | Wang et al. |
| 2013/0228884 A1 | 9/2013 | Zheng et al. |
| 2013/0229866 A1 | 9/2013 | Ranjan et al. |
| 2013/0236639 A1 | 9/2013 | Carey et al. |
| 2013/0242435 A1 | 9/2013 | Fuji et al. |
| 2013/0250661 A1 | 9/2013 | Sandhu et al. |
| 2013/0288392 A1 | 10/2013 | Nozieres et al. |
| 2013/0313665 A1 | 11/2013 | Rhie et al. |
| 2013/0314815 A1 | 11/2013 | Yuan et al. |
| 2013/0334630 A1 | 12/2013 | Kula et al. |
| 2013/0334631 A1 | 12/2013 | Kinney et al. |

(56) References Cited

U.S. PATENT DOCUMENTS

| | | |
|---|---|---|
| 2014/0008742 A1 | 1/2014 | Chen et al. |
| 2014/0015076 A1 | 1/2014 | Gan et al. |
| 2014/0021426 A1 | 1/2014 | Lee et al. |
| 2014/0027869 A1 | 1/2014 | Lee et al. |
| 2014/0038312 A1 | 2/2014 | Lee et al. |
| 2014/0063656 A1 | 3/2014 | Hashimoto |
| 2014/0064047 A1 | 3/2014 | Niwa et al. |
| 2014/0070341 A1 | 3/2014 | Beach et al. |
| 2014/0084398 A1 | 3/2014 | Oguz et al. |
| 2014/0099735 A1 | 4/2014 | Horng et al. |
| 2014/0116984 A1 | 5/2014 | Ding et al. |
| 2014/0151843 A1 | 6/2014 | Millward et al. |
| 2014/0157065 A1 | 6/2014 | Ong |
| 2014/0217526 A1 | 8/2014 | Guo |
| 2014/0242419 A1 | 8/2014 | Singh et al. |
| 2014/0264663 A1 | 9/2014 | Chen et al. |
| 2014/0268301 A1 | 9/2014 | Ding et al. |
| 2014/0269064 A1 | 9/2014 | Jeon et al. |
| 2014/0272454 A1 | 9/2014 | Zhang et al. |
| 2014/0287537 A1 | 9/2014 | Shukh |
| 2014/0293436 A1 | 10/2014 | Nagahama et al. |
| 2014/0308542 A1 | 10/2014 | Zhang et al. |
| 2014/0327095 A1 | 11/2014 | Kim et al. |
| 2014/0334032 A1 | 11/2014 | Nishioka et al. |
| 2014/0339504 A1* | 11/2014 | Kim .............. H01L 43/12 257/16 |
| 2014/0367814 A1 | 12/2014 | Ohmori et al. |
| 2015/0028439 A1 | 1/2015 | Kula et al. |
| 2015/0041933 A1 | 2/2015 | Chepulskyy et al. |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |
| 2015/0179916 A1 | 6/2015 | Pramanik et al. |
| 2015/0249202 A1 | 9/2015 | Siddik et al. |
| 2015/0270478 A1 | 9/2015 | Annunziata et al. |
| 2015/0287910 A1 | 10/2015 | Lu et al. |
| 2015/0295164 A1 | 10/2015 | Sandhu et al. |
| 2015/0303372 A1 | 10/2015 | Meade et al. |
| 2015/0340601 A1 | 11/2015 | Huai et al. |
| 2016/0005954 A1 | 1/2016 | Erickson et al. |
| 2016/0086645 A1 | 3/2016 | Erickson et al. |
| 2016/0111632 A1 | 4/2016 | Sandhu et al. |
| 2016/0155932 A1 | 6/2016 | Chen et al. |

FOREIGN PATENT DOCUMENTS

| | | | | |
|---|---|---|---|---|
| CN | 101461064 A | 6/2009 | | |
| CN | 102246327 A | 11/2011 | | |
| CN | 102610270 A | 7/2012 | | |
| CN | 104241286 A | 12/2014 | | |
| EP | 1353443 A2 | 10/2003 | | |
| EP | 1885006 A1 | 2/2008 | | |
| EP | 2385548 A1 | 11/2011 | | |
| EP | 2541554 A1 | 1/2013 | | |
| EP | 2015307 B1 | 10/2013 | | |
| GB | 2343308 A | 5/2000 | | |
| JP | 08007235 A | 1/1996 | | |
| JP | H87235 | 1/1996 | | |
| JP | 2002314049 A | 10/2002 | | |
| JP | 2004104076 A | 4/2004 | | |
| JP | 2004179668 A | 6/2004 | | |
| JP | 2006165059 A | 6/2006 | | |
| JP | 2007173843 A | 7/2007 | | |
| JP | 2008-10590 | * | 1/2008 | ............ H01L 43/08 |
| JP | 2008010590 A | 1/2008 | | |
| JP | 2008192926 A | 8/2008 | | |
| JP | 2008198792 A | 8/2008 | | |
| JP | 2008270835 A | 11/2008 | | |
| JP | 2009194366 A | 8/2009 | | |
| JP | 2010087355 A | 4/2010 | | |
| JP | 2010093157 A | 4/2010 | | |
| JP | 2011119755 A | 6/2011 | | |
| JP | 2011521391 A | 7/2011 | | |
| JP | 2012064624 A | 3/2012 | | |
| JP | 2012142480 A | 7/2012 | | |
| JP | 2012519957 A | 8/2012 | | |
| JP | 2012204432 A | 10/2012 | | |
| JP | 2012244031 A | 12/2012 | | |
| JP | 2013156846 A | 8/2013 | | |
| KR | 1020040092342 A | 11/2004 | | |
| KR | 1020070094431 A | 9/2007 | | |
| KR | 1020080029852 A | 4/2008 | | |
| KR | 1020120008295 | 1/2012 | | |
| KR | 1020120130701 A | 12/2012 | | |
| WO | 2010026831 A1 | 11/2010 | | |
| WO | 2010134378 A1 | 11/2010 | | |
| WO | 2010137679 A1 | 12/2010 | | |
| WO | 2011001746 A1 | 1/2011 | | |
| WO | 2011149274 A2 | 12/2011 | | |
| WO | 2011159422 A1 | 12/2011 | | |
| WO | 2012128891 A1 | 9/2012 | | |
| WO | 2012160937 A1 | 11/2012 | | |
| WO | 2013176332 A1 | 11/2013 | | |
| WO | 2013191920 A1 | 12/2013 | | |
| WO | 2014097520 A1 | 6/2014 | | |

OTHER PUBLICATIONS

Rodmacq et al., Influence of Thermal Annealing on the Perpendicular Magnetic Anisotropy of Pt/Co/AlOx Trilayers, Physical Review B, vol. 79, (2009), pp. 024423-1-024423-8.

Sato et al., Perpendicular-Anisotropy CoFeB—MgO Magnetic Tunnel Junctions with a MgO/CoFeB/Ta/CoFeB/MgO Recording Structure, Applied Physics Letters, vol. 101, (2012), pp. 022414-1-022414-4.

Stone et al., Tuning of Ferromagnetism Through Anion Substitution in Ga—Mn-Pnictide Ferromagnetic Semiconductors, Physica B, vol. 401-402, (2007), pp. 454-457.

Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.

Tsunekawa et al., Effect of Capping Layer Material on Tunnel Magnetoresistance in CoFeB—MgO—CoFeB Magentic Tunnel Junctions, Digests of the IEEE International Magnetics Conference (Apr. 2005), pp. 1983-1984.

Taiwan Search Report for ROC (Taiwan) Patent Application No. 104139568, (completion date Sep. 1, 2016), 1 page.

Vitos et al., The Surface Energy of Metals, Surface Science, vol. 411, (1998), pp. 186-202.

Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.

Wang et al., C-Spin Kickoff Meeting Presentation, Semiconductor Research Corp., (Mar. 26, 2013), Minneapolis, Minnesota, (available at https://www.src.org/library/publication/p066203/), 195 pages.

Wang et al., "Low-Power Non-volatile Spintronic Memory: STT-MRAM and Beyond," J. Phys. D: Applied Physics, vol. 46, (Jan. 31, 2013), pp. 1-10.

Wilson et al., New Materials for Micro-Scale Sensors and Actuators: An Engineering Review, Materials Science and Engineering R, vol. 56, (2007), pp. 1-129.

Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.

Worledge et al., Spin Torque Switching of Perpendicular Ta|CoFeB|MgO-Based Magnetic Tunnel Junctions, Applied Physics Letters, vol. 98, (2011), pp. 022501-1-022501-3.

Wu et al., Tuning Magnetic Anisotropies of Fe Films on Si(111) Substrate Via Direction Variation of Heating Current, Scientific Reports, vol. 3, (Mar. 26, 2013), pp. 1-5.

You et al., Spin Transfer Torque and Tunneling Magnetoresistance Dependences on Finite Bias Voltages and Insulator Barrier Energy, Thin Solid Films, vol. 519, (2011), pp. 8247-8251.

Yu et al., 1/f Noise in MgO Double-Barrier Magnetic Tunnel Junctions, Applied Physics Letters, vol. 98, (2011), pp. 112504-1-112504-3.

(56) References Cited

OTHER PUBLICATIONS

Zhang, Anisotropic Magnetomechanical Effect in Tb0.3Dy0.7Fe2 Alloy, Journal of Magnetism and Magnetic Materials, vol. 324, (2012), pp. 190-195.
Zhu et al., Magnetic Tunnel Junctions, MaterialsToday, vol. 9, No. 11, (Nov. 2006), pp. 36-45.
Ando et al., Electrically Tunable Spin Injector Free from the Impedance Mismatch Problem, Nature Materials, vol. 10 (Sep. 2011), pp. 655-659.
Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).
Auwarter et al., Co on h-BN/Ni(1 1 1): From Island to Island-Chain Formation and Co Intercalation, Surface Science, vol. 511, (2002), pp. 379-386.
Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).
Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.
Butler et al., "Spin-Dependent Tunneling Conductance of Fe|MgO|Fe Sandwiches," Physical Review B, vol. 63, (Jan. 8, 2001), 054416-1-054416-12.
Carrey et al., Influence of Interface Alloying on the Magnetic Properties of Co/Pd Multilayers, Applied Physics Letters, vol. 83, No. 25, (Dec. 22, 2003), pp. 5259-5261.
Cha et al., Atomic-Scale Spectroscopic Imaging of CoFeB/Mg—B—O/CoFeB Magnetic Tunnel Junctions, Applied Physics Letters, vol. 95, (2009), pp. 032506-1-032506-3.
Chen et al., Advances and Future Prospects of Spin-Transfer Torque Random Access Memory, IEEE Transactions on Magnetics, vol. 46, No. 6, (Jun. 2010), pp. 1873-1878.
Diao et al., Spin Transfer Switching in Dual MgO Magnetic Tunnel Junctions, Applied Physics Letters, vol. 90, (2007), pp. 132508-1-132508-3.
Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages (abstract only).
Farle et al., The Temperature Dependence of Magnetic Anisotropy in Ultra-Thin Films, Journal of Magnetism and Magnetic Materials, vol. 165, (1997), pp. 74-77.
Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.
Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.
Greenwood et al., Chemistry of Elements, Second Edition, (1997), pp. 23-25.
Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 14, No. 19, (2005), pp. L587-L589.
Heczko et al., Strain and Concurrent Magnetization Changes in Magnetic Shape Memory Ni—Mn—Ga Single Crystals—Experiment and Model, Materials Science and Engineering A, vol. 481-482, (2008), pp. 283-287.
Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.
Hindmarch et al., Zirconium as a Boron Sink in Crystalline CoFeB/MgO/CoFeB Magnetic Tunnel Junctions, the Japan Society of Applied Physics, 2011, pp. 1-3.
Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.
International Search Report for International Application No. PCT/US2015/062453 dated Mar. 10, 2016, 4 pages.
International Written Opinion for International Application No. PCT/US2015/062453 dated Mar. 10, 2016, 8 pages.
Kaufman, Myron, "Principles of Thermodynamics," Taylor & Francis Group LLC, (2002), Chap. 7: Chemical Reactions, 9 pages.
Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 page (abstract only).
Knovel Sampler, Knovel, (2003), http://app.knovel.com/web/view/html/show.v/rcid:kpKS000009/cid:kt003BCMZ2/viewerType:html/root_slug:front-matter/url_slug:front-matter?b-q=ioniz; 2 pages.
Ko et al., Effects of MgO and MgO/Pd Seed-Layers on Perpendicular Magnetic Anisotropy of CoPd Thin Films, Thin Solid Films, vol. 519, (2011), pp. 8252-8255.
Kohda et al., Width and Temperature Dependence of Lithography-Induced Magnetic Anisotropy in (Ga,Mn)As Wires, Physica E, vol. 42, (2010), pp. 2685-2689.
Kula et al., Memory Cells, Methods of Fabrication, Semiconductor Device Structures, Memory Systems, and Electronic Systems, U.S. Appl. No. 13/948,839, filed Jul. 23, 2014.
Kurt et al., Giant tunneling magnetoresistance with electron beam evaporated MgO barrier and CoFeB electrodes, Journal of Applied Physics, Apr. 2010, vol. 107, pp. 1-6.
Lavrijsen et al., Tuning the Interlayer Exchange Coupling Between Single Perpendicularly Magnetized CoFeB Layers, Appl. Phys. Lett., vol. 100, (2012), pp. 052411-1-052411-5.
Lee et al., Improved Magnetic Tunnel Junction With Amorphous Seed Layer, Surface Treatment, and High-Polarization Magnetic Materials, Jul. 2004, IEEE, IEEE Transactions on Magnetics, vol. 40. No. 4, all pages.
Löhndorf et al., Characterization of Magnetostrictive TMR Pressure Sensors by MOKE, Journal of Magnetism and Magnetic Materials, vol. 316, (2007), pp. e223-e225.
Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.
Maehara et al., Tunnel Magnetoresistance Above 170% and Resistance-Area Product of 1 O (μm)2 Attained by In Situ Annealing of Ultra-Thin MgO Tunnel Barrier, Applied Physics Express, vol. 4, (2011), 2 pages (abstract only).
Author's name is Hiroki Maehara. Hiroki et al., Tunnel Magnetoresistance above 170% and Resistance-Area Product of 1 ohm (micrometer)2 Attained by In Situ Annealing of Ultra-Thin MgO Tunnel Barrier, Mar. 10, 2011, Applied Physics Express 4 (2011) 033002 1-3.
Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.
Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.
Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.
Miao et al., Theoretical investigation on the transition-metal borides with Ta3B4-type structure: A class of hard and refractory materials, 2011, Computational Materials Science, Elsevier, pp. 1559-1566.
Miracle et al., An Assessment of Binary Metallic Glasses: Correlations Between Structure, Glass Forming Ability and Stability (Preprint), Air Force Research Laboratory, (2011), 97 pages.

(56) References Cited

OTHER PUBLICATIONS

Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.

Moroz et al., Modeling the Impact of Stress on Silicon Processes and Devices, Materials Science in Semiconductor Processing, vol. 6, (2003), pp. 27-36.

Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.

Nishitani et al., Magnetic Anisotropy in a Ferromagnetic (Ga,Mn)Sb Thin Film, Physica E, vol. 42, (2010), pp. 2681-2684.

S. Pinitsoontom et al., "Three-dimensional atom probe investigation of boron distribution in CofeB/MgO/CoFeB magnetic tunnel junctions" Applied Physics Letters, vol. 93, American Institute of Physics, 2008, pp. 071901-1 to 071901-3.

Piramanayagam, S. N., Perpendicular Recording Media for Hard Disk Drives, Journal of Applied Physics, vol. 102, (2007), pp. 011301-1-011301-22.

Resnik et al., Mechanical Stress in Thin Film Microstructures on Silicon Substrate, Vacuum, vol. 80, (2005), pp. 236-240.

Japanese Office Action from Japanese Application No. 2017528872, dated May 11, 2018, 11 pages with English translation.

Extended European Search Report from European Application No. 15864457.5, dated Jul. 12, 2018, 7 pages.

Notice of Reasons for Rejection from Korean Application No. 10-2017-7017984, dated Sep. 13, 2018, 17 pages.

\* cited by examiner

MAGNETIC CELL STRUCTURES, AND METHODS OF FABRICATION

CROSS-REFERENCE TO RELATED APPLICATION

This application is a continuation of U.S. patent application Ser. No. 14/558,367, filed Dec. 2, 2014, now U.S. Pat. No. 9,768,377, issued Sep. 19, 2017, the disclosure of which is hereby incorporated herein in its entirety by this reference.

TECHNICAL FIELD

Embodiments disclosed herein relate to magnetic cell structures including magnetic regions. More specifically, embodiments disclosed herein relate to semiconductor structures and magnetic cell structures including seed materials and magnetic structures exhibiting improved magnetic properties, associated magnetic cell structures, and to methods of forming such semiconductor structures and magnetic cell structures.

BACKGROUND

Magnetic Random-Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region in between. The free region and the fixed region may exhibit magnetic orientations that are either horizontally oriented ("in-plane") or perpendicularly oriented ("out-of-plane") relative to the width of the regions. The fixed region includes a magnetic material that has a substantially fixed magnetic orientation (e.g., a non-switchable magnetic orientation during normal operation). The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region). This state of low electrical resistance may be defined as a "0" logic state of the STT-MRAM cell. In the anti-parallel configuration, the STT-MRAM cell exhibits a higher electrical resistance across the magnetoresistive elements. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region polarizes the electron spin of the programming current, and torque is created as the spin-polarized current passes through the core. The spin-polarized electron current exerts torque on the free region. When the torque of the spin-polarized electron current passing through the core is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the read and write operations of the STT-MRAM cell. After switching the magnetic orientation of the free region to achieve the parallel configuration or the anti-parallel configuration associated with a desired logic state, the magnetic orientation of the free region is usually desired to be maintained, during a "storage" stage, until the STT-MRAM cell is to be rewritten to a different configuration (i.e., to a different logic state).

However, the presence of a magnetic dipole field emitted from the fixed region may impair the ability to symmetrically switch the magnetic orientation of the free region during operation of the STT-MRAM cell. Efforts have been made to eliminate the negative effects of switching due to interference from a stray magnetic dipole field. For example, magnetic materials including a synthetic antiferromagnet including an upper magnetic region and a lower magnetic region separated by a coupling material may reduce the negative effect of stray magnetic dipole fields. Each of the upper magnetic region and the lower magnetic region may include magnetic materials separated from each other by a conductive material. The coupling material is formulated and positioned to provide an anti-parallel coupling of adjacent magnetic materials. The goal is that a magnetic dipole field emitted by the upper region will be effectively canceled by a magnetic dipole emitted by the lower region due to the opposite directions of the respective magnetic orientations. However, magnetic coupling between the upper region and the lower region may exhibit oscillatory behavior between ferromagnetic coupling and antiferromagnetic coupling. Further, in conventional synthetic antiferromagnets, growth of the upper magnetic region may be limited by the type and thickness of the coupling material, whereas the magnetic characteristics (e.g., the PMA, the magnetic hysteresis, etc.) of the lower magnetic region may be determined by an underlying conventional seed material, that may include tantalum and ruthenium. For example, magnetic regions located farther from the seed material than other magnetic regions (e.g., magnetic regions that are distal from the seed material) may exhibit a crystalline structure that is different from the other magnetic regions and the seed material, which may cause the magnetic cell structure including the magnetic regions to exhibit structural defects and a reduced PMA.

Efforts to couple the coupling material to the upper and lower magnetic materials include annealing the coupling material and the upper and lower magnetic materials. However, while annealing may improve the crystal structure of the magnetic materials and improve the adhesion between the magnetic materials and the coupling material, annealing may reduce the magnetic properties (e.g., the magnetic anisotropy ("MA") and the perpendicular magnetic anisotropy ("PMA")) of the magnetic materials. Annealing may also affect the strength of the coupling between the magnetic materials and the coupling material which may affect the antiferromagnetism and/or the antiferromagnetism of the coupled magnetic structure. For example, annealing may alter the crystal orientation of the magnetic material and may create in-plane or out-of-plane magnetic moments that may interfere with reading and writing operations of the memory cell. Thus, annealing may reduce the PMA of the magnetic materials and may create out-of-plane magnetic dipole moments that interfere with operation of a magnetic cell structure incorporating the magnetic materials.

DETAILED DESCRIPTION

The illustrations included herewith are not meant to be actual views of any particular systems or semiconductor structures, but are merely idealized representations that are employed to describe embodiments described herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing semiconductor structures, magnetic cell structures, or memory cells, and the semiconductor structures, magnetic cell structures, and memory cells described below do not form a complete semiconductor structure, magnetic cell structure, or memory cell. Only those process acts and structures necessary to understand the embodiments described herein are described in detail below. Additional acts to form a complete semiconductor structure and a memory cell including the semiconductor structure may be performed by conventional techniques.

According to some embodiments, a magnetic memory cell structure may include one or more magnetic regions over a seed material. The seed material may influence a crystal structure and a magnetic orientation of the magnetic regions overlying the seed material. The seed material may be formulated and configured to exhibit a similar crystalline structure as the magnetic regions that overlie the seed material. The seed material may include three materials, such as tantalum, platinum, and ruthenium and may be referred to herein as a "platinum-containing seed material." The tantalum, platinum, and ruthenium of the disclosure may form distinct portions of the seed material. The magnetic cell structure including the seed material of the disclosure may exhibit an improved magnetic anisotropy (e.g., an improved PMA) compared to magnetic cell structures including conventional seed materials. The magnetic cell structure including the platinum-containing seed material may also exhibit improved adhesion after annealing at temperatures above about 300° C. without exhibiting a degradation of magnetic properties (e.g., a reduced PMA or an increase of an in-plane magnetic moment). Magnetic cell structures and memory cells including the magnetic memory cell structures with the platinum-containing seed material may thus exhibit improved magnetic properties and switching characteristics compared to magnetic cell structures with conventional seed materials including only two materials (e.g., tantalum and ruthenium).

Figure 1A:
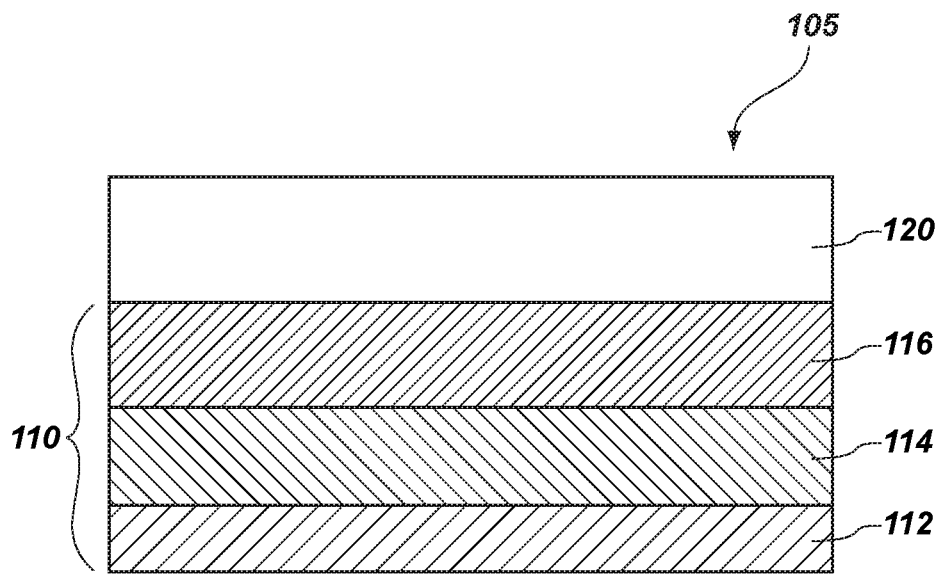
FIG. 1A is a simplified cross-sectional view of a magnetic material formed over a seed material.

FIG. 1A illustrates a magnetic structure 105 including an artificial superlattice ("ASL") structure 120 overlying a seed material 110 that may form a portion of a magnetic memory cell structure. The seed material 110 may include a tantalum portion 112, a platinum portion 114, and a ruthenium portion 116. The artificial superlattice structure 120 may directly overlie and contact the seed material 110. The crystal structure and orientation of the ruthenium portion 116 may be substantially similar to the crystal structure of the artificial superlattice structure 120.

The seed material 110 may include more than one portion, such as the tantalum portion 112, the platinum portion 114, and the ruthenium portion 116. The tantalum portion 112 may overlie a substrate (not shown) or another portion of a magnetic memory cell. The platinum portion 114 may directly overlie and contact the tantalum portion 112 and the ruthenium portion 116 may directly overlie and contact the platinum portion 114. The platinum portion 114 may be disposed between the tantalum portion 112 and the ruthenium portion 116 and may directly contact each of the tantalum portion 112 and the ruthenium portion 116. Each of the tantalum portion 112, the platinum portion 114, and the ruthenium portion 116 may be distinct materials and may form an interface with adjacent portions. The tantalum portion 112 may include between about ninety atomic percent tantalum and about one-hundred atomic percent tantalum, the platinum portion 114 may include between about ninety atomic percent platinum and about one-hundred atomic percent platinum, and the ruthenium portion 116 may include between about ninety atomic percent ruthenium and about one-hundred atomic percent ruthenium.

The tantalum portion 112 may have a thickness of between about 20 Å and about 40 Å, such as between about 20 Å and about 25 Å, between about 25 Å and about 35 Å, or between about 35 Å and about 40 Å. In some embodiments, the tantalum portion 112 has a thickness of about 30 Å. The platinum portion 114 may have a thickness of between about 10 Å and about 1,000 Å, such as between about 10 Å and about 50 Å, between about 50 Å and about 100 Å, between about 100 Å and about 200 Å, between about 200 Å and about 300 Å, between about 300 Å and about 500 Å, or between about 500 Å and about 1,000 Å. In some embodiments, the platinum portion 114 has a thickness of about 50 Å. The ruthenium portion 116 may have a thickness of between about 35 Å and about 65 Å, such as between about 35 Å and about 45 Å, between about 45 Å and about 55 Å, or between about 55 Å and about 65 Å. In some embodiments, the ruthenium portion 116 has a thickness of about 50 Å. In some embodiments, the thickness of the tantalum portion 112 may be about 30 Å, the thickness of the platinum portion 114 may be about 50 Å, and the thickness of the ruthenium portion may be about 50 Å.

The seed material 110 may be formed by sputter deposition, such as by magnetron sputtering (e.g., high-power impulse magnetron sputtering (HIPIMS), DC magnetron sputtering, etc.), ion-beam sputtering, or other physical vapor deposition (PVD) methods. The seed material 110 may be also formed by at least one of atomic layer deposition (ALD), chemical vapor deposition (CVD), plasma enhanced chemical vapor deposition (PECVD), low pressure chemical vapor deposition (LPCVD), or other film deposition processes. The seed material 110 may be formed by forming the tantalum portion 112 over a base material (not shown). The platinum portion 114 may be formed over and in direct contact with the tantalum portion 112. The ruthenium portion 116 may be formed over and in direct contact with the platinum portion 114. Each of the tantalum portion 112, the platinum portion 114, and the ruthenium portion 116 of the seed material 110 may be formed at room temperature.

Figure 1B:
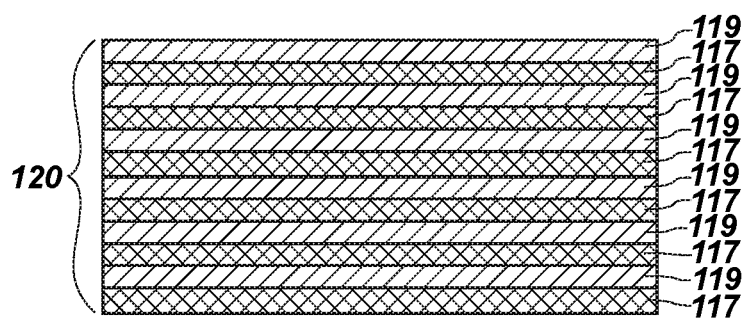
FIG. 1B is a simplified cross-sectional view of a magnetic material including alternating portions of a magnetic material and a conductive material.

Referring to FIG. 1B, the artificial superlattice structure 120 may include alternating portions of a magnetic material 117 and a conductive material 119. The conductive material 119 may be between adjacent magnetic materials 117. The conductive material 119 may enable the magnetic material 117 to exhibit a perpendicular anisotropy (i.e., a vertical magnetic orientation). The magnetic material 117 may include at least one of cobalt and iron. The conductive material 119 may include at least one of platinum, palladium, iridium, and nickel. In some embodiments, the magnetic material 117 includes cobalt and the conductive material 119 includes at least one of platinum, palladium, nickel, and iridium. Although FIG. 1B depicts six regions of magnetic material 117 and six regions of conductive material 119 in the artificial superlattice structure 120, the artificial superlattice structure 120 is not so limited and may include any number (e.g., one, two, three, four, or five) of alternating regions of magnetic material 117 and conductive material 119.

The magnetic material 117 may have a thickness of approximately one monolayer. By way of example and not limitation, the magnetic material 117 may have a thickness of between about 1.0 Å and about 6.0 Å, such as between about 1.0 Å and about 2.0 Å, between about 2.0 Å and about 3.0 Å, between about 3.0 Å and about 4.0 Å, or between about 4.0 Å and about 6.0 Å. In some embodiments, the magnetic material 117 has a thickness of about 2.4 Å. The conductive material 119 may have a thickness of approximately one monolayer. By way of example and not limitation, the conductive material 119 may have a thickness of between about 1.2 Å and about 2.0 Å, such as between about 1.2 Å and about 1.6 Å, or between about 1.6 Å and about 2.0 Å. In some embodiments, the conductive material 119 has a thickness of about 1.6 Å.

In some embodiments, a region of the conductive material 119 of the artificial superlattice structure 120 may directly overlie and contact the seed material 110. For example, a region of the conductive material 119 may directly overlie and contact the ruthenium portion 116 of the seed material 110. In other embodiments, a region of the magnetic material 117 may directly overlie and contact the seed material 110.

A crystal structure of the seed material 110 may be improved (e.g., by removing defects in a grain structure of the seed material 110) by exposing the seed material 110 to annealing conditions. Annealing the magnetic structure 105 of FIG. 1A may also increase a coupling strength (e.g., adhesion) between the magnetic material 117 and the conductive material 119 of the artificial superlattice structure 120. The seed material 110 and the artificial superlattice structure 120 may be annealed by exposing the seed material 110 and the artificial superlattice structure 120 to a temperature of between about 300° C. and about 500° C. for from between about one minute (1 min.) to about one hour (1 hr.) without damaging the artificial superlattice structure 120 or any other materials adjacent the seed material 110. In some embodiments, the seed material 110 and the artificial superlattice structure 120 may be annealed at a temperature greater than about 300° C. for about one hour. In other embodiments, the seed material 110 and the artificial superlattice structure 120 are annealed at a temperature of about 400° C. for between about fifteen minutes and about thirty minutes. In yet other embodiments, the seed material 110 and the artificial superlattice structure 120 are annealed at 300° C. for about one hour, or at a temperature of about 360° C. for about one hour. The anneal may be performed in a vacuum. The seed material 110 and the artificial superlattice structure 120 may exhibit an improved PMA and MA compared to memory cells including conventional seed materials, such as seed materials including only tantalum and ruthenium. For example, the structure of FIG. 1A including the seed material 110 and the artificial superlattice structure 120 may be less prone to alteration of its magnetic orientation than a magnetic material formed over a conventional seed material.

Accordingly, a magnetic cell structure is disclosed. The magnetic cell structure comprises a tantalum portion overlying a substrate, a platinum portion overlying the tantalum portion, and a ruthenium portion overlying the platinum portion, and a magnetic region over the seed material.

Accordingly, a method of forming a magnetic cell structure is disclosed. The method comprises forming a seed material comprising tantalum, platinum, and ruthenium over a substrate, forming the seed material comprising forming tantalum over the substrate, forming platinum over the tantalum, forming ruthenium over the platinum, and further comprising forming a magnetic material over the seed material.

Figure 2:
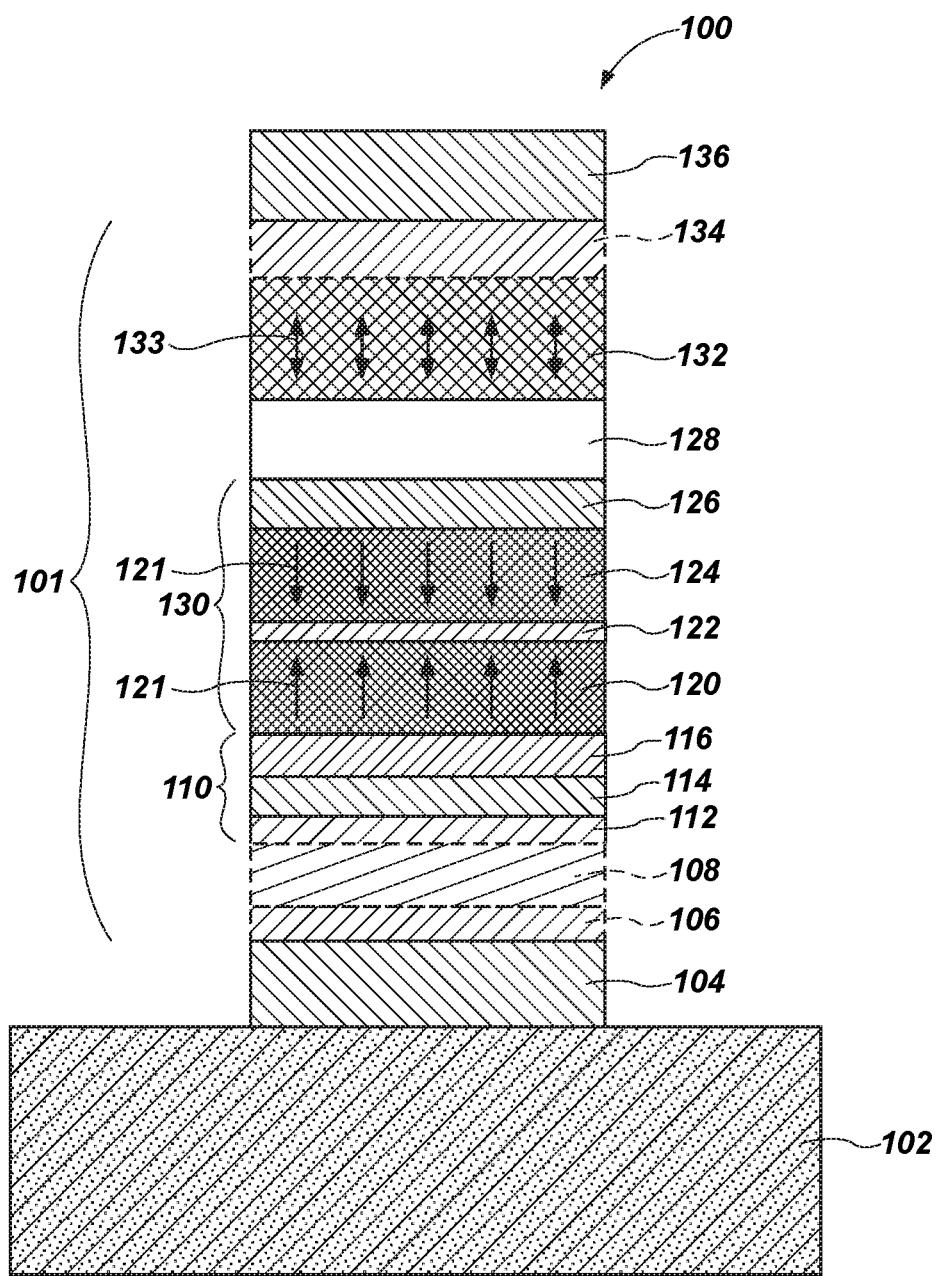
FIG. 2 is a simplified cross-sectional view of a magnetic cell structure including the seed material according to an embodiment of the disclosure.

Referring to FIG. 2, a magnetic cell structure 100 including a seed material 110 according to some embodiments is illustrated. The magnetic cell structure 100 includes a magnetic cell core 101 over a substrate 102. The magnetic cell core 101 may be disposed between an upper electrode 136 and a lower electrode 104. The magnetic cell core 101 may include a magnetic region and another magnetic region, for example, a "fixed region" 130 and a "free region" 132, respectively. An insulating region 128 may be disposed between the fixed region 130 and the free region 132.

The substrate 102 may include a base material or other construction upon which components, such as those within memory cells, are formed. The substrate 102 may be a semiconductor substrate, a base semiconductor material on a supporting substrate, a metal electrode, or a semiconductor substrate having one or more materials, structures, or regions formed thereon. The substrate 102 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium (Si1−xGex, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation.

The lower electrode 104 may overlie the substrate 102. The lower electrode 104 may include a metal such as copper, tungsten, platinum, palladium, titanium, tantalum, nickel, titanium nitride (TiN), tantalum nitride (TaN), tungsten nitride (WN), polysilicon, a metal silicide, a metal alloy, or combinations thereof.

One or more lower intermediary regions 106 may, optionally, be disposed under the magnetic regions (e.g., the fixed region 130 and the free region 132). The lower intermediary region 106, if included, may be configured to inhibit diffusion of species between the lower electrode 104 and materials overlying the lower electrode 104. The lower intermediary region 106 may include a conductive material such as one or more of copper, tantalum, titanium, tungsten, ruthenium, tantalum nitride, and titanium nitride.

An amorphous material 108 may, optionally, overlie the lower intermediary region 106, if present, and be disposed between the lower intermediary region 106 and the seed material 110. In some embodiments, the amorphous material 108 may directly overlie the lower electrode 104. In other embodiments, such as that illustrated in FIG. 2, the amorphous material 108 may directly overlie the lower intermediary region 106. The amorphous material 108 may reduce the number of defects in a crystal structure of the seed material 110 and the magnetic cell structure 100. The amorphous material 108 may provide a smooth template upon which overlying materials, such as the seed material 110 (e.g., the tantalum portion 112 (FIG. 1A) of the seed material 110), are formed. The amorphous material 108 may increase the PMA and the magnetic coupling of the magnetic cell structure 100.

In some embodiments, the amorphous material 108 is formulated and configured to enable formation of the seed material 110 to exhibit a desired crystal structure. The amorphous material 108 may cause each component of the magnetic cell structure 100 to exhibit a similar magnetic orientation throughout the entire magnetic cell structure 100. Thus, the fixed region 130 of the magnetic cell structure 100 may exhibit a similar crystal orientation as the amorphous material 110.

The amorphous material 108 may include a material that is substantially amorphous. The amorphous material 108 may include amorphous tantalum, amorphous tantalum oxide, an amorphous material including nickel, chromium, oxides thereof, an amorphous material including nickel oxide and chromium oxide, and combinations thereof. An upper portion of the amorphous material 108 may be oxidized. For example, the amorphous material 108 may include tantalum with an upper portion including tantalum oxide, or the amorphous material 108 may include nickel and chromium with an upper portion thereof including nickel oxide and chromium oxide. In some embodiments, the amorphous material 108 may include about forty atomic percent nickel and about sixty atomic percent chromium (e.g., $Ni_{60}Cr_{40}$).

The amorphous material 108 may have a thickness of between about 5 Å and about 15 Å, such as between about 5 Å and about 10 Å, or between about 10 Å and about 15 Å. In some embodiments, the amorphous material 108 has a thickness of about 10 Å.

The seed material 110 may be disposed over the lower electrode 104. In some embodiments, the seed material 110 may be in direct contact with the lower electrode 104. In other embodiments, the lower intermediary region 106 may intervene between the lower electrode 104 and the seed material 110, or the seed material 110 may be in direct contact with the amorphous material 108, if present.

The seed material 110 may be the same as described above with reference to FIG. 1A. For example, the seed material 110 may include the tantalum portion 112, the platinum portion 114, and the ruthenium portion 116. The platinum portion 114 may be disposed directly between the tantalum portion 112 and the ruthenium portion 116. The ruthenium portion 116 may be in direct contact with the overlying artificial superlattice structure 120.

The fixed region 130 may be formed directly over the seed material 110. The fixed region 130 may include the artificial superlattice structure 120, a coupling material 122 overlying the artificial superlattice structure 120, and another artificial superlattice structure 124 overlying the coupling material 122. The artificial superlattice structure 120 and the another artificial superlattice structure 124 may be the same as described above with reference to FIG. 1B. Thus, the artificial superlattice structure 120 and the another artificial superlattice structure 124 may include alternating regions of the magnetic material 117 and the conductive material 119. The artificial superlattice structure 120 and the another artificial superlattice structure 124 may include the same materials and may be substantially the same. In some embodiments, each of the artificial superlattice structure 120 and the another artificial superlattice structure 124 may include alternating portions of a cobalt magnetic material and a platinum conductive material.

The artificial superlattice structure 120 may directly overlie the seed material 110. In some embodiments, the conductive material 119 of the artificial superlattice structure 120 may be in direct contact with the ruthenium portion 116 of the seed material 110. In other embodiments, the magnetic material 117 of the artificial superlattice structure 120 may be in direct contact with seed material 110.

The coupling material 122 may directly overlie the artificial superlattice structure 120. The coupling material 122 may include ruthenium, rhodium, and combinations thereof. The coupling material 122 may have a thickness between about 1 Å and about 10 Å. In some embodiments, the coupling material 122 has a thickness between about 4 Å and about 5 Å.

The another artificial superlattice structure 124 may directly overlie the coupling material 122. As described above, the another artificial superlattice structure 124 may include the same materials and may be substantially the same as the artificial superlattice structure 120.

In other embodiments, the fixed region 130 includes a ferromagnetic material including cobalt and iron (e.g., $Co_xFe_y$, wherein x=10 to 80 and y=10 to 80) and, in some embodiments, also boron (e.g., $Co_xFe_yB_z$, wherein x=10 to 80, y=10 to 80, and z=0 to 50). Thus, the fixed region 130 may include at least one of Co, Fe, and B (e.g., a CoFeB material, a FeB material, a CoB material). In other embodiments, the fixed region 130 may alternatively or additionally include nickel (e.g., an NiB material).

As shown in FIG. 2, the artificial superlattice structure 120 and the another artificial superlattice structure 124 of the fixed region 130 may include a fixed magnetic orientation, which is indicated by arrows 121. The fixed magnetic orientation may be north, south, east, west, etc. The fixed magnetic orientation of the artificial superlattice structure 120 and the another artificial superlattice structure 124 may be the same.

A capping material 126 may overlie the another artificial superlattice structure 124. The capping material 126 may include a CoFeB material. As used herein, the term "CoFeB material" means and includes a material comprising cobalt (Co), iron (Fe), and boron (B) (e.g., $Co_xFe_yB_z$, wherein x=10 to 80, y=10 to 80, and z=0 to 50). A CoFeB material may or may not exhibit magnetism, depending on its configuration (e.g., its thickness). The capping material 126 may directly overlie and contact the another artificial superlattice structure 124. The capping material 126 may contact the magnetic material 117 or the conductive material 119 of the artificial superlattice structure 124. The capping material 126 may have a thickness of between about 5 Å and about 15 Å, such as between about 5 Å and about 10 Å, or between about 10 Å and about 15 Å. In some embodiments, the capping material 126 has a thickness of about 10 Å.

An insulating region 128 may overlie the capping material 126. In some embodiments, the insulating region 128 directly overlies and contacts the capping material 126. The insulating region 128 may include a nonmagnetic (e.g., magnetically insulative) material including oxide materials and nitride materials such as magnesium oxide (MgO), aluminum oxide ($Al_2O_3$), titanium dioxide ($TiO_2$), titanium nitride (TiN), aluminum nitride (AlN), or other oxide or nitride materials in conventional magnetic tunnel junction (MTJ) regions. The insulating region 128 may be configured to induce magnetic anisotropy in the free region 132 and to function as a tunnel region of a MTJ effected by interaction of the fixed region 130, the insulating region 128, and the free region 132. In other embodiments, the insulating region 128 may include an electrically conductive, non-magnetic material, such as materials used in spin valve structures.

The magnetic cell core 101 may further include the free region 132 disposed over the insulating region 128. The free region 132 may be homogeneous, or may include more than one sub-region. The free region 132 may include a magnetic material exhibiting a switchable magnetic orientation, indicated by arrows 133 during use and operation of the memory cell. The switchable magnetic orientation may be switched between a parallel configuration and an anti-parallel configuration by the application of a current or applied field to the magnetic cell structure 100.

In some embodiments, the free region 132 may be a conventional free region (i.e., a magnetic region including different materials than the artificial superlattice structure 120, the another artificial superlattice structure 124, and the coupling material 122). In other embodiments, the free region 132 may include the same materials as each of the artificial superlattice structure 120 and the another artificial superlattice structure 124 of the fixed region 130. The free region 132 may include alternating portions of a magnetic material 117 and a conductive material 119, similar to the artificial superlattice structure 120 and the another artificial superlattice structure 124. However, the free region 132 is not so limited and may include other suitable magnetic materials that exhibit a switchable magnetic orientation.

One or more upper intermediary regions 134 may, optionally, be disposed over the free region 132. The upper intermediary region 134, if included, may be configured to inhibit diffusion of species between the upper electrode 136 and underlying materials during operation of the memory cell. The upper intermediary region 134 may include a conductive material (e.g., one or more materials such as copper, tantalum, titanium, tungsten, ruthenium, tantalum nitride, or titanium nitride) that may form a conductive capping region. In other embodiments, the upper intermediary region 134 may also include an insulating material such as MgO, $Al_2O_3$, $TiO_2$, and combinations thereof.

The upper electrode 136 may overlie the upper intermediary region 134. The upper electrode 136 may include copper, tungsten, platinum, palladium, titanium, tantalum, nickel, titanium nitride, tantalum nitride, tungsten nitride, polysilicon, a metal silicide, a metal alloy, or combinations thereof. In some embodiments, the upper electrode 136 includes the same materials as the lower electrode 104.

The magnetic cell structure 100 of FIG. 2 is configured as a "bottom-pinned" memory cell (i.e., a memory cell in which the fixed region 130 is disposed under the free region 132). However, in other embodiments, such as that of FIG. 3, a fixed region 130' may overlie a free region 132'. Thus, with reference to FIG. 3, a magnetic cell structure 150 may be configured as a top-pinned memory cell. The magnetic cell structure 150 may include a magnetic cell core 101' disposed between the lower electrode 104 and the upper electrode 136.

The magnetic cell structure 150 may include a lower intermediary region 106 overlying the lower electrode 104. The amorphous material 108 may overlie the lower intermediary region 106, if present. The seed material 110 may overlie the amorphous material 108, if present. In other embodiments, the seed material 110 may directly overlie the lower intermediary region 106, if present, or the lower electrode 104. The seed material 110 may be the same as described above with reference to FIG. 1A and FIG. 2. For example, the seed material 110 may include the tantalum portion 112, the platinum portion 114, and the ruthenium portion 116. The platinum portion 114 may be disposed directly between the tantalum portion 112 and the ruthenium portion 116.

The free region 132' may directly overlie the seed material 110. For example, the free region 132' may directly overlie and contact the ruthenium portion 116 of the seed material 110. The free region 132' may include the same materials as described above with reference to FIG. 2. The free region 132' may include a switchable magnetic orientation, indicated by arrows 133.

An insulating region 128' may overlie the free region 132'. The insulating region 128' may include the same materials described above with reference to FIG. 2. The insulating region 128' may be disposed directly between the free region 132' and the fixed region 130'.

The fixed region 130' may directly overlie the insulating region 128'. The fixed region 130' may include a fixed magnetic orientation, indicated by arrows 121. The fixed region 130' may include an artificial superlattice structure 120', a coupling material 122', another artificial superlattice structure 124', and a capping material 126'. Each of the artificial superlattice structure 120', the coupling material 122', the another artificial superlattice structure 124', and the capping material 126' may be the same as the artificial superlattice structure 120, the coupling material 122, the another artificial superlattice structure 124, and the capping material 126, respectively, as described above with reference to FIG. 2. However, the fixed region 130' may not directly overlie the seed material 110 as in the magnetic cell structure 100 of FIG. 2. Rather, the artificial superlattice structure 120' of the fixed region 130' may directly contact the underlying insulating region 128'.

The optional upper intermediary region 134 may overlie the capping material 126'. The upper electrode 136 may overlie the upper intermediary region 134, if present.

Figure 3:
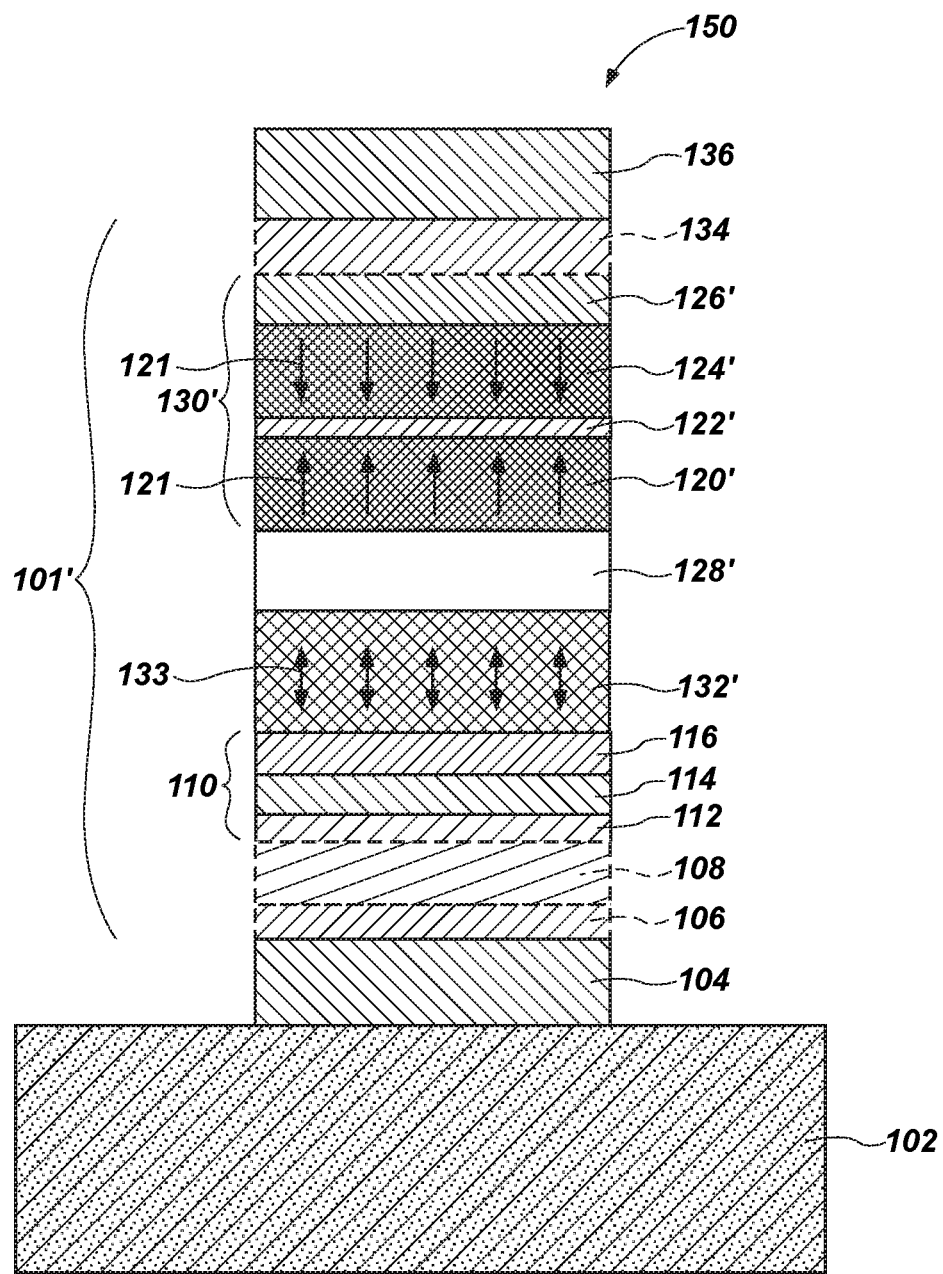
FIG. 3 is a simplified cross-sectional view of a magnetic cell structure including the seed material according to another embodiment of the disclosure.

The memory cells of embodiments of the disclosure may be configured as "out-of-plane" STT-MRAM cells. "Out-of-plane" STT-MRAM cells may include magnetic regions exhibiting a magnetic orientation that is predominately oriented in a vertical direction (e.g., a direction that is perpendicular to a width and length of the respective region or a direction that is perpendicular to a primary surface of the substrate on which the STT-MRAM cell is located). For example, as illustrated in FIG. 2 and FIG. 3, an STT-MRAM cell may be configured to exhibit a vertical magnetic orientation in at least one of the magnetic regions (e.g., the fixed region 130 and the free region 132). As indicated in FIG. 2 and FIG. 3, each of the fixed region 130 and the free region 132 may exhibit a vertical magnetic orientation as indicated by the arrows 121 and the arrows 133. The magnetic orientation of the fixed region 130 may remain directed in essentially the same direction throughout use and operation of the STT-MRAM cell, for example, in the direction indicated by arrows 121. The magnetic orientation of the free region 132, on the other hand, may be switched during use and operation of the cell, between a parallel configuration and an anti-parallel configuration, as indicated by the arrows 133.

A semiconductor device may include at least one memory cell including the magnetic cell structure of the disclosure disposed between a pair of electrodes.

Accordingly, a semiconductor device is disclosed. The semiconductor device comprises at least one magnetic cell structure overlying an electrode over a substrate, the at least one magnetic cell structure comprising a seed material comprising tantalum, platinum, and ruthenium overlying an electrode on a substrate, a magnetic region overlying the seed material, an insulating material overlying the magnetic region, another magnetic region overlying the insulating material, and another electrode overlying the another magnetic region.

Referring to FIG. 4A through FIG. 4D, a method of forming the magnetic cell structure 100 of FIG. 2 is shown. The method may include forming a magnetic cell structure 200 over a substrate 202. A lower electrode material 204 may be formed over the substrate 202. The lower electrode material 204 may include any of the materials described above with reference to the lower electrode 104.

An intermediary region material 206 may, optionally, be formed over the lower electrode material 204. The lower intermediary region material 206 may be formed from any of the materials described above with reference to the lower intermediary region 106. In some embodiments, the lower intermediary region material 206 may be incorporated with the conductive material of the lower electrode material 204. For example, the lower intermediary region material 206 may be an upper-most sub-region of the lower electrode material 204.

An amorphous material 208 may be formed over the lower electrode material 204 or the lower intermediary region material 206, if present. The amorphous material 208 may include the same materials as described above with reference to the amorphous material 108. The amorphous material 208 may be exposed to oxidizing conditions to oxidize an upper portion of the amorphous material 208. By way of non-limiting example, the amorphous material 208 may be exposed to an oxidizing atmosphere at a temperature of between about 20° C. and about 50° C. for between about one minute and about thirty minutes.

Figure 4A:
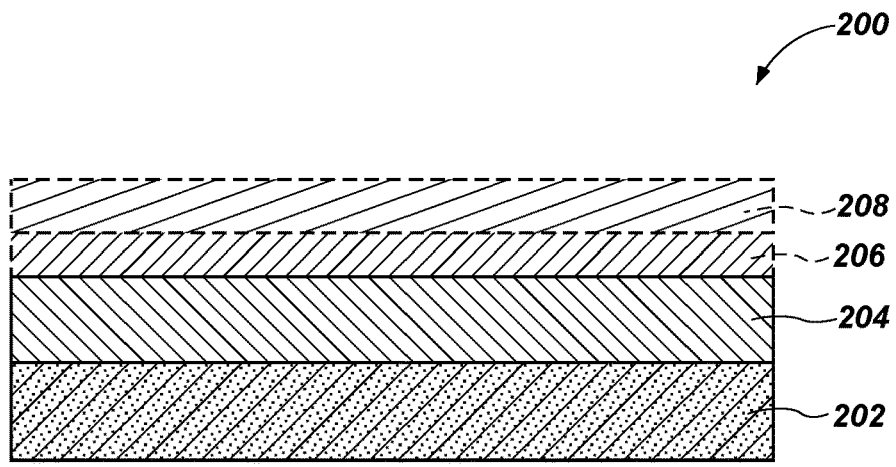
FIGS. 4A through FIG. 4D are simplified cross-sectional views illustrating different process stages for an embodiment of a method for forming the magnetic cell structure of FIG. 2.
Figure 4B:
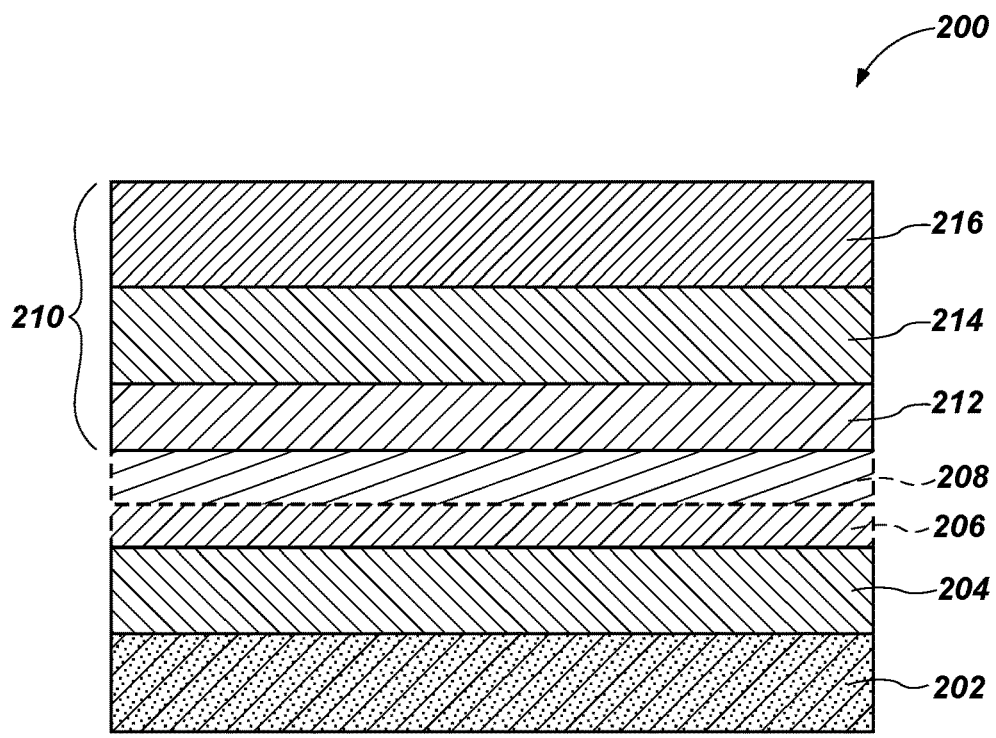

Referring to FIG. 4B, a seed material 210 may be formed over the amorphous material 208, if present, the lower intermediary region material 206, if present, or the lower electrode material 204. The seed material 210 may be formed as described above with reference to FIG. 1A. For example, a tantalum material 212 may be formed over the amorphous material 208. A platinum material 214 may be formed over the tantalum material 212 and a ruthenium material 216 may be formed over the platinum material 214. The platinum material 214 may be formed directly between the tantalum material 212 and the ruthenium material 216. Each of the tantalum material 212, the platinum material 214, and the ruthenium material 216 may be formed by sputter deposition, such as by magnetron sputtering (e.g., high-power impulse magnetron sputtering (HIPIMS), dc magnetron sputtering, etc.), ion-beam sputtering, or other PVD methods. The seed material 210 may be also formed by at least one of ALD, CVD, PECVD, LPCVD, or other film deposition processes. Each of the tantalum material 212, the platinum material 214, and the ruthenium material 216 may be formed to a thickness as described above with reference to the seed material 110.

Figure 4C:
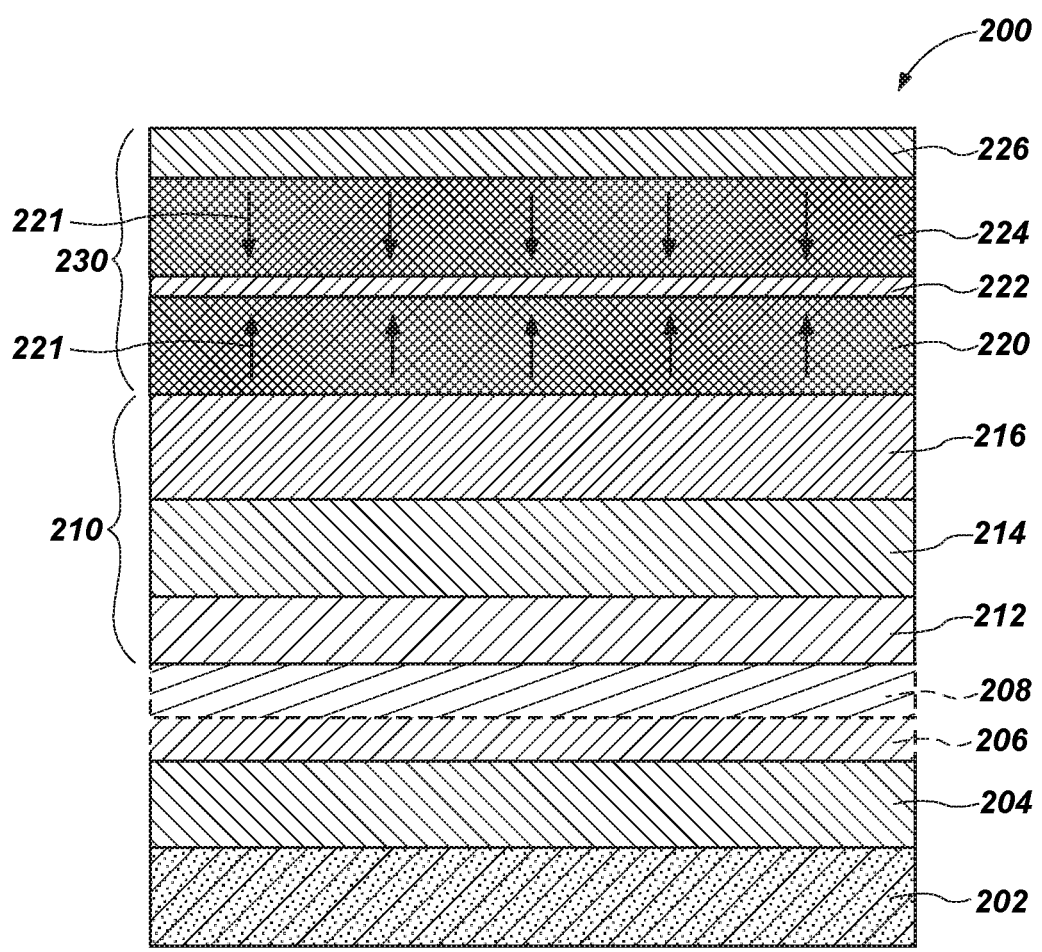

Referring to FIG. 4C, a fixed region material 230 may be formed over the seed material 210. The fixed region material 230 may include an artificial superlattice structure material 220 over the seed material 210, a coupling material 222 over the artificial superlattice material 220, another artificial superlattice material 224 over the coupling material 222, and a capping material 226 over the another artificial superlattice material 224. The fixed region material 230 may include a fixed magnetic orientation, which is indicated by arrows 221.

The artificial superlattice structure material 220 may be formed directly over the ruthenium material 216 of the seed material 210. The artificial superlattice structure material 220 may be formed of alternating portions of a magnetic material 117 and a conductive material 119 as described above with reference to the artificial superlattice structure 120 of FIG. 1B.

The coupling material 222 may be formed over the artificial superlattice structure material 220. The coupling material 222 may be formed between the artificial superlattice structure material 220 and the another artificial superlattice structure material 224. The coupling material 222 may be formed of the same materials as described above with reference to the coupling material 122. The coupling material 222 may be formed by at least one of ALD, CVD, PVD, PECVD, LPCVD, or other film deposition processes.

The another artificial superlattice material 224 may be formed directly over the coupling material 222. The another artificial superlattice material 224 may be formed in the same manner and from the same materials as the artificial superlattice material 220.

The capping material 226 may be formed directly over the another artificial superlattice material 224. The capping material 226 may be formed of a magnetic material such as CoFeB. The capping material 226 may be formed to a thickness of between about 5 Å and about 15 Å, such as between about 5 Å and about 10 Å, or between about 10 Å and about 15 Å. In some embodiments, the capping material 226 is formed to a thickness of about 10 Å.

Figure 4D:
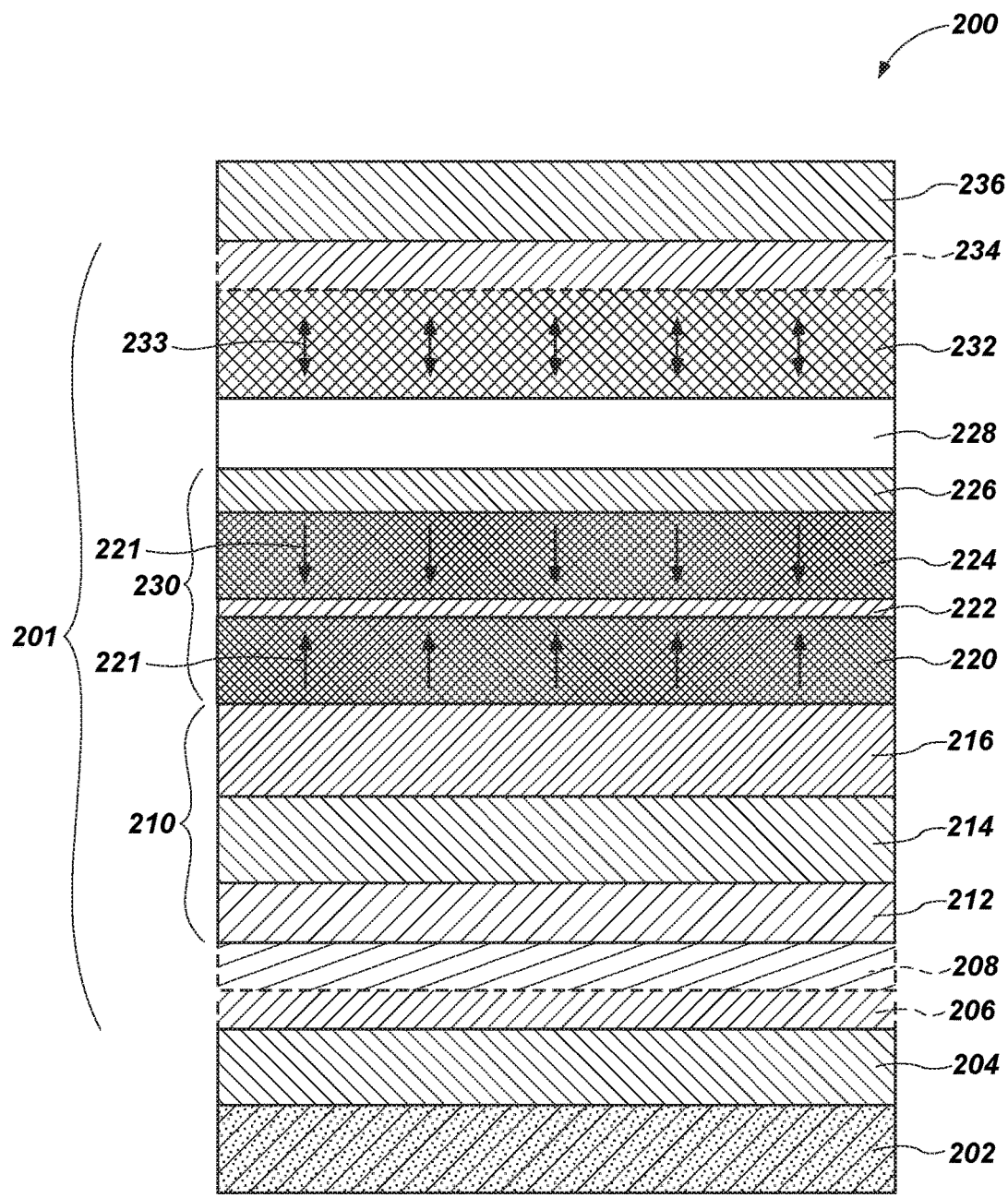

Referring to FIG. 4D, an insulating material 228 may be formed over the capping material 226. The insulating material 228 may be formed between the capping material 226 of the fixed region material 230 and a free region material 232. The insulating material 228 may be formed from the same materials as described above with reference to the insulating region 128. The insulating material 228 may be formed by at least one of ALD, CVD, PECVD, LPCVD, PVD, or other film deposition processes.

The free region material 232 may be formed directly over the insulating material 228. The free region material 232 may be formed of the same materials and by similar methods as the artificial superlattice material 220 and the another artificial superlattice material 224 of the fixed region material 230. The free region material 232 may include a magnetic material exhibiting a switchable magnetic orientation, indicated by arrows 233.

An upper intermediary region material 234 may optionally be formed over the free region material 232 and may include the same materials as the lower intermediary region material 206. Thus, a magnetic cell core 201 may include the lower intermediary region material 206, the amorphous material 208, the seed material 210, the fixed region material 230, the insulating material 228, the free region material 232, and the upper intermediary region material 234.

An upper electrode material 236 may be formed over the upper intermediary region material 234, if present, or over the free region material 232. The upper electrode material 236 may include the same materials as described above with reference to the upper electrode 136.

The magnetic cell structure 200 may be processed to form the magnetic cell structure 100 (FIG. 2) as shown in FIG. 2. The magnetic cell structure 200 may be processed by conventional photolithography, material removal, etching, or other processes that are not described in detail herein.

The seed material 210 and the magnetic cell structure 100 or the magnetic cell structure 200 may be exposed to annealing conditions to crystallize different portions of the magnetic cell structure 100. For example, the magnetic cell structure 100 may be exposed to a temperature of between about 300° C. and about 500° C. (e.g., about 400° C.) and may be held at the annealing temperature for from about one minute (about 1 min.) to about one hour (about 1 hr.). In some embodiments, the magnetic cell structure 100 is annealed for about one hour at about 300° C. The annealing temperature and time may be tailored based on the materials of the magnetic cell structure 100. In some embodiments, the magnetic cell structure 100 is annealed in stages. For example, the magnetic cell structure 100 may be annealed at 300° C. for about one hour and then annealed at about 360° C. for about one hour. In other embodiments, the magnetic cell structure 100 is annealed at about 400° C. for between about fifteen minutes and about thirty minutes.

Although the magnetic cell structure 200 described with reference to FIG. 4A through FIG. 4D describes forming the magnetic cell structure 100 of FIG. 2, the magnetic cell structure 150 of FIG. 3 may be formed by similar methods. However, the free region 132 would be formed over the seed material 110, the insulating material 228 would be formed over the free region 132, and the fixed region 130 would be formed over the insulating material 228, resulting in the magnetic cell structure 150 of FIG. 3.

Annealing the magnetic cell structure 100 may increase the PMA and the coupling strength of the artificial superlattice structure 120 and the another artificial superlattice structure 124 to the coupling material 122. The magnetic cell structure 100 may be annealed to antiferromagnetically couple the artificial superlattice structure 120 and the another artificial superlattice structure 124. A coupling material having a thickness of between about 4 Å and about 5 Å may exhibit an improved antiferromagnetic coupling between the artificial superlattice structure 120 and the another artificial superlattice structure 124 and may not exhibit ferromagnetic coupling of the materials.

The platinum portion 114 of the seed material 110 may increase the thermal stability of the magnetic cell structure 100. For example, in some embodiments, the magnetic cell structure 100 may be annealed at temperatures up to or exceeding about 400° C. without degrading the magnetic properties (e.g., formation of in-plane magnetic dipole moments).

Figure 5:
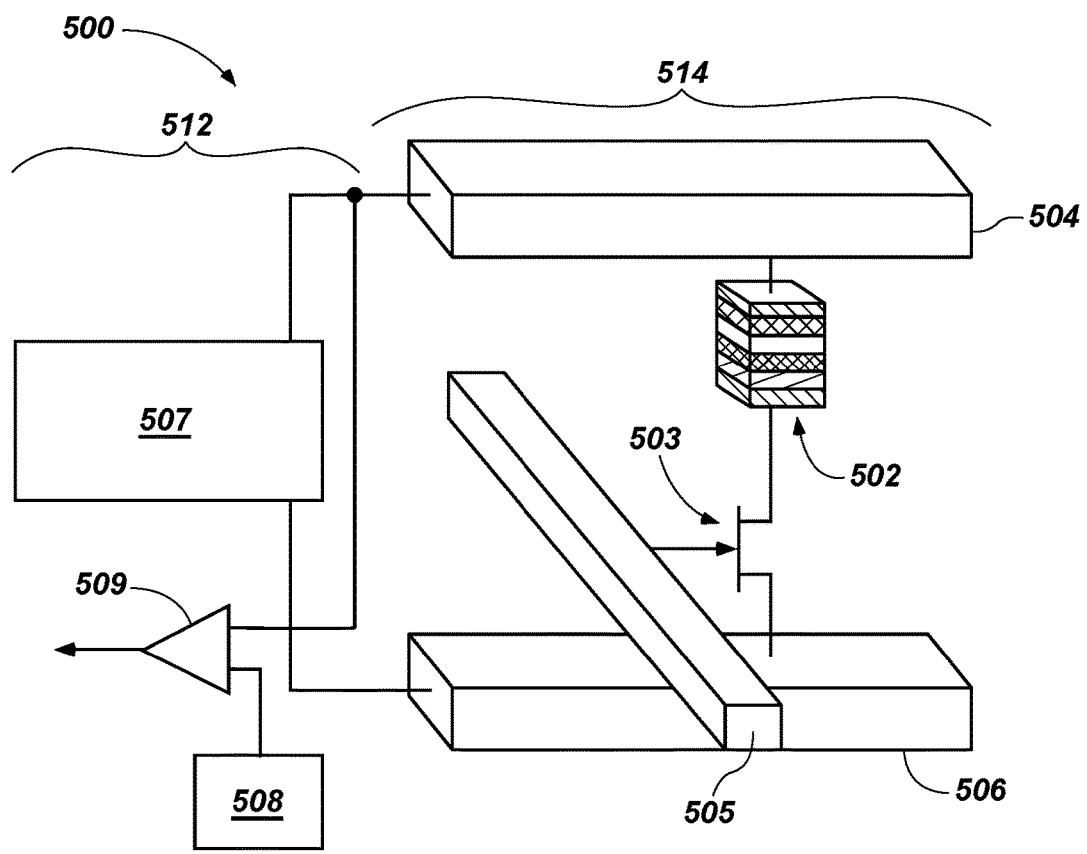
FIG. 5 is a schematic of an STT-MRAM system including a memory cell having a magnetic cell structure according to an embodiment of the disclosure.

With reference to FIG. 5, illustrated is an STT-MRAM system 500 that includes peripheral devices 512 in operable communication with an STT-MRAM cell 514, a grouping of which may be fabricated to form an array of memory cells in a grid pattern including a number of rows and columns, or in various other arrangements, depending on the system requirements and fabrication technology. The STT-MRAM cell 514 may include a magnetic cell core 502, an access transistor 503, a conductive material that may function as a data/sense line 504 (e.g., a bit line), a conductive material that may function as an access line 505 (e.g., a word line) and a conductive material that may function as a source line 506. The peripheral devices 512 of the STT-MRAM system may include read/write circuitry 507, a bit line reference 508, and a sense amplifier 509. The magnetic cell core 502 may be any one of the magnetic cell cores 101, 101' described above.

The array of memory cells include a plurality of magnetic cell structures 100, 150 arranged in an array over a substrate. The magnetic cell structures 100, 150 may each include a magnetic cell core 101, 101', which magnetic cell cores 101, 101' may have been formed according to a method described above. The array of memory cells may include a plurality of memory cell structures arranged in a grid pattern. Each memory cell of the array of memory cells may be disposed between the lower electrode 104 and the upper electrode 136, such as in a cross-point array of memory cells.

Accordingly, a semiconductor device is disclosed. The semiconductor device comprises an array of spin torque transfer magnetic random-access memory (STT-MRAM) cells, each STT-MRAM cell comprising a seed material overlying a first electrode on a substrate, the seed material comprising tantalum, platinum, and ruthenium, a magnetic region overlying the seed material, an insulating material overlying the magnetic region, and another magnetic region overlying the insulating material, and a second electrode overlying each of the STT-MRAM cells.

Accordingly, a method of forming a semiconductor device is disclosed. The method comprises forming an array of magnetic cell structures over an electrode on a substrate, forming the array of magnetic cell structures comprising forming a seed material comprising tantalum, platinum, and ruthenium over an electrode on a substrate, forming a magnetic material over the seed material, forming an insulating material over the magnetic material, and forming another magnetic material over the insulating material, and further comprising forming another electrode over the another magnetic region of each of the magnetic cell structures of the array.

In use and operation, when an STT-MRAM cell 514 is selected to be programmed, a programming current is applied to the STT-MRAM cell 514, and the current is spin-polarized by the fixed region of the magnetic cell core 502 and exerts a torque on the free region of the cell core 502, which switches the magnetization of the free region to "write to" or "program" the STT-MRAM cell 514. In a read operation of the STT-MRAM cell 514, a current is used to detect the resistance state of the magnetic cell core 502.

To initiate programming of the STT-MRAM cell 514, the read/write circuitry 507 may generate a write current (i.e., a programming current) to the data/sense line 504 and the source line 506. The polarity of the voltage between the data/sense line 504 and the source line 506 determines the switch in magnetic orientation of the free region in the magnetic cell core 502. By changing the magnetic orientation of the free region with the spin polarity, the free region is magnetized according to the spin polarity of the programming current and the programmed logic state is written to the STT-MRAM cell 514.

To read the STT-MRAM cell 514, the read/write circuitry 507 generates a read voltage to the data/sense line 504 and the source line 506 through the cell core 502 and the access transistor 503. The programmed state of the STT-MRAM cell 514 relates to the electrical resistance across the cell core 502, which may be determined by the voltage difference between the data/sense line 504 and the source line 506. In some embodiments, the voltage difference may be compared to the bit line reference 508 and amplified by the sense amplified 509.

FIG. 5 illustrates one example of a STT-MRAM system 500 including at least one memory cell. It is contemplated, however, that the magnetic cell cores 101, 101' may be incorporated and utilized within any STT-MRAM system configured to incorporate a magnetic cell core having magnetic regions. It is also contemplated that the magnetic cell cores 101, 101' may be used in other magnetic memory cells besides STT-MRAM cells.

EXAMPLES

Example 1

Figure 6:
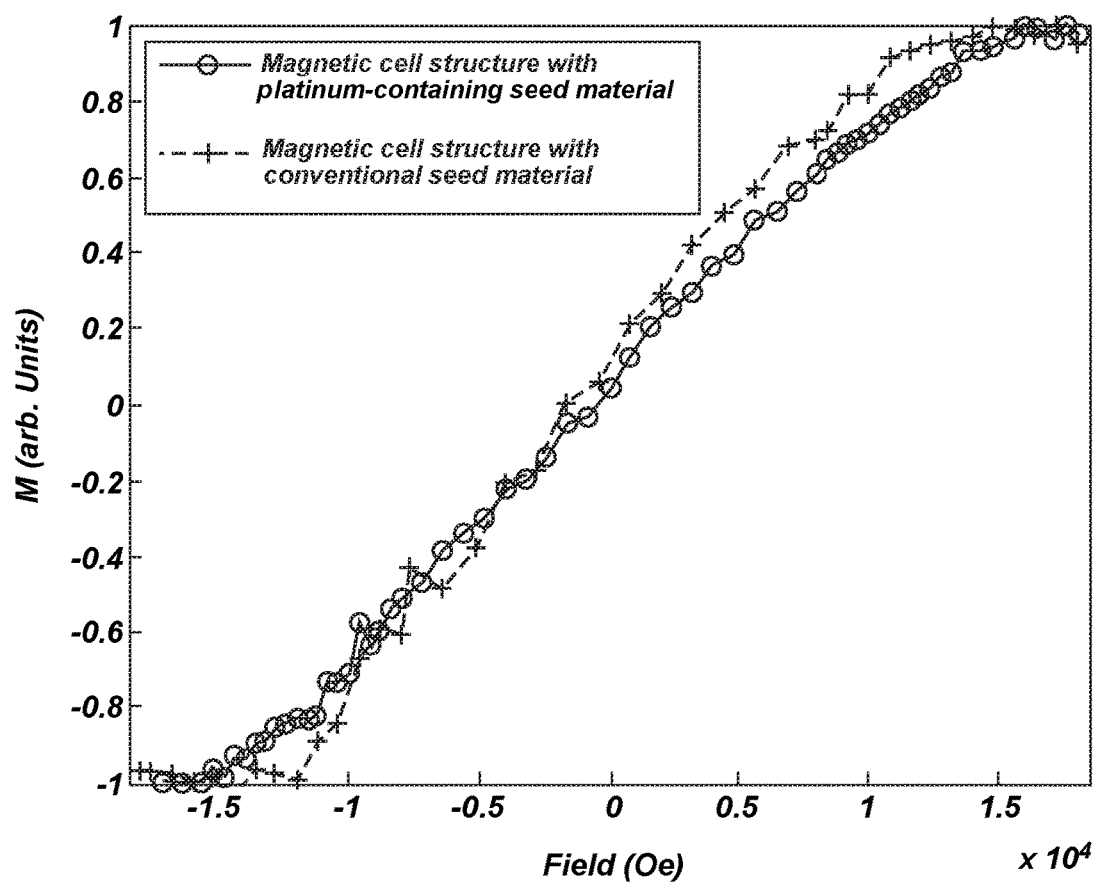
FIG. 6 is an in-plane loop plot comparing the anisotropy field (i.e., $H_k$) of a magnetic structure including the platinum-containing seed material compared to a magnetic structure including a conventional seed material.

FIG. 6 is a graphical representation of the anisotropy field (i.e., $H_k$) of a magnetic structure including the platinum-containing seed material compared to a magnetic structure including a conventional seed material (e.g., including only tantalum and ruthenium). A magnetic structure including alternating regions of cobalt and platinum was formed over each of the platinum-containing seed material and the conventional seed material. The platinum-containing seed material included approximately 30 Å of tantalum over a substrate, approximately 50 Å of platinum over the tantalum, and approximately 50 Å of ruthenium over the platinum. The conventional seed material included approximately 30 Å of tantalum over a substrate and approximately 50 Å of ruthenium directly over the tantalum. The anisotropy field of the magnetic structure including the platinum-containing seed material was approximately twenty-five percent (25%) greater than the anisotropy of the magnetic structure including the conventional seed material. For example, the in-plane loop evaluation indicated an Hk value (an indication of MA strength) of approximately 15,000 Oe for the magnetic structure including the platinum-containing seed material as compared to approximately 12,000 Oe of the magnetic structure with the conventional seed material. The in-plane loop evaluation indicated an improved PMA for the magnetic structure including the platinum-containing seed material. The magnetic structure including the seed material including platinum was also less prone to alteration of its magnetic orientation than the magnetic structure formed over the conventional seed material.

Example 2

Figure 7:
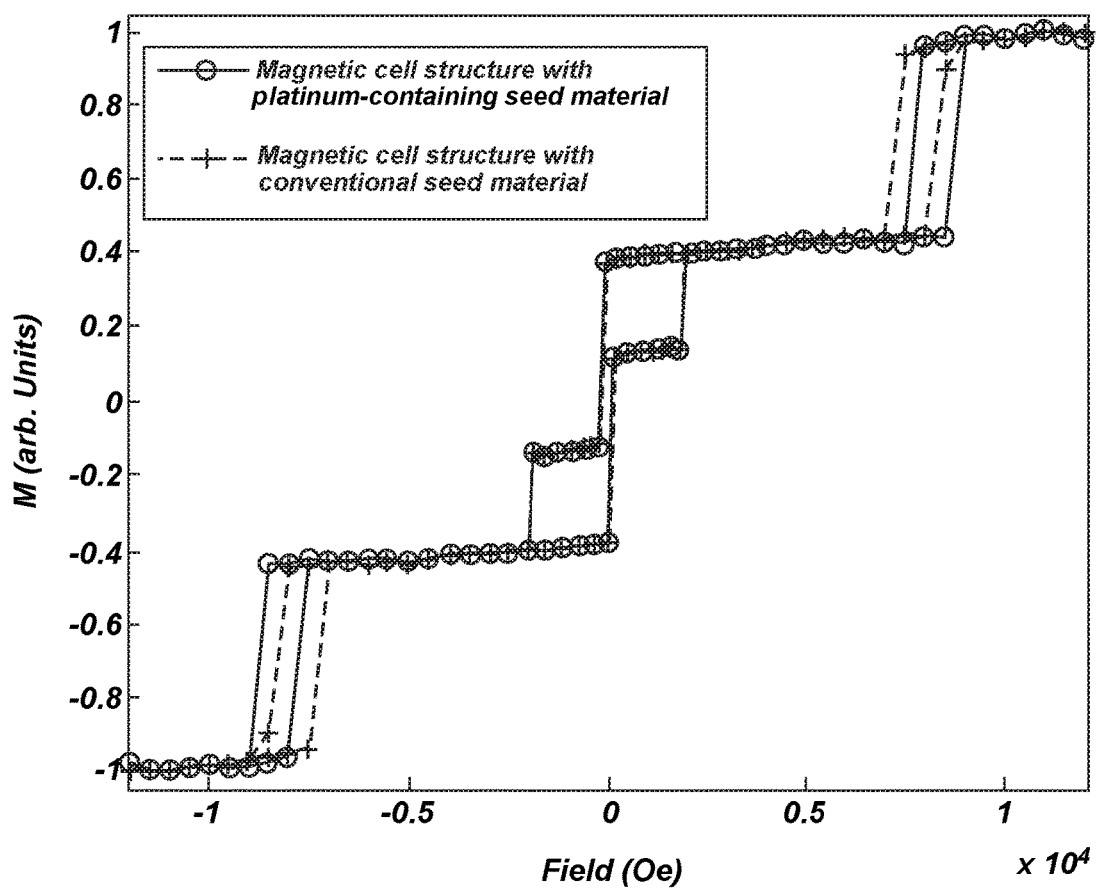
FIG. 7 is an out-of-plane loop plot comparing the magnetic properties of the magnetic cell structure of FIG. 2 to a magnetic cell structure including a conventional seed material after annealing each of the structures at 300° C.

FIG. 7 is an out-of-plane loop comparing the magnetic properties of a magnetic cell structure including a conventional seed material to the magnetic properties of a magnetic cell structure including the platinum-containing seed material. A magnetic cell structure similar to the magnetic cell structure 100 of FIG. 2 was formed over a platinum-containing seed material and over a conventional seed material. The platinum-containing seed material included approximately 30 Å of tantalum over a substrate, approximately 50 Å of platinum over the tantalum, and approximately 50 Å of ruthenium over the platinum. The conventional seed material included tantalum over a substrate and ruthenium over the tantalum. Each of the magnetic cell structures were exposed to annealing conditions at approximately 300° C. for about 1 hour. The magnetic cell structure including the platinum-containing seed material exhibited an improved exchange coupling compared to the magnetic cell structure including the conventional seed material. The magnetic cell structure with the platinum-containing seed material exhibited an exchange coupling field for the upper artificial superlattice structure of the fixed region (e.g., the another artificial superlattice structure 124) of about 8,255 Oe while the magnetic cell structure with the conventional seed material exhibited an exchange coupling strength between the upper and lower artificial superlattice structures of the fixed region (e.g., between the artificial superlattice structure 120 and the another artificial superlattice structure 124) of about 7,750 Oe. Thus, the magnetic cell structure including the platinum-containing seed material exhibited an about seven percent (7%) increase in out-of-plane magnetic field (e.g., an increase in the PMA) compared to the other magnetic cell structure.

Figure 8A:
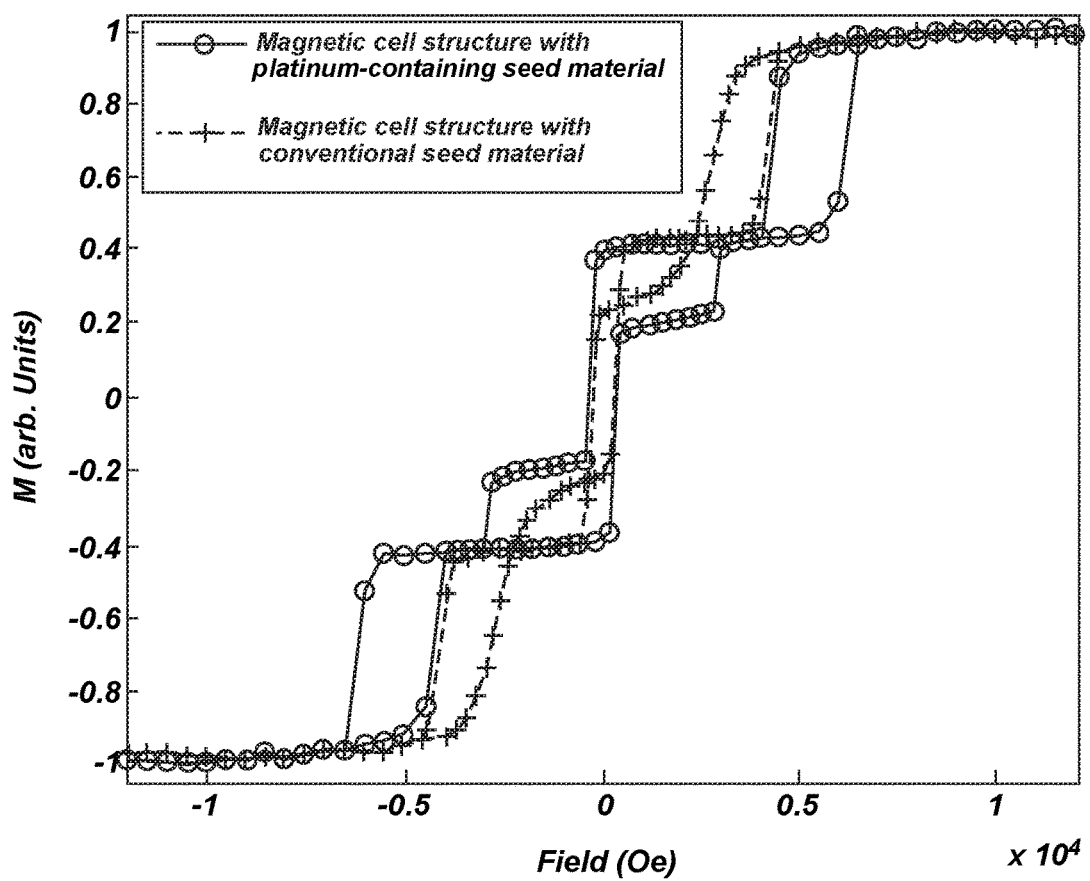
FIG. 8A is an out-of-plane loop plot comparing the magnetic properties of the magnetic cell structure of FIG. 2 to a magnetic cell structure including a conventional seed material after annealing each of the structures at 300° C. followed by annealing each of the structures at 360° C.

Referring to FIG. 8A, out-of-plane loop plots comparing the magnetic properties of the magnetic cell structures described with reference to FIG. 7 after the magnetic cell structures were exposed to another anneal of approximately 360° C. for about 1 hour are shown. The magnetic cell structure including the platinum-containing seed material exhibited less magnetic degradation than the magnetic cell structure including the conventional seed material after the additional anneal at approximately 360° C. For example, an upper magnetic region (e.g., the another artificial superlattice structure 124 of FIG. 2) of the magnetic cell structure with the platinum-containing seed material exhibited an improved PMA and stronger coupling to the coupling material (e.g., the coupling material 122 of FIG. 2) than the magnetic cell structure with the conventional seed material. The platinum-containing seed material minimized the amount that the magnetoresistance of the magnetic cell structure was reduced after annealing. For example, annealing the magnetic cell structure with the conventional seed material reduced the magnetoresistance of the structure by approximately forty-six percent (46%) while annealing the magnetic cell structure with the platinum-containing seed material reduced the magnetoresistance of the structure by approximately twenty-seven percent (27%).

Figure 8B:
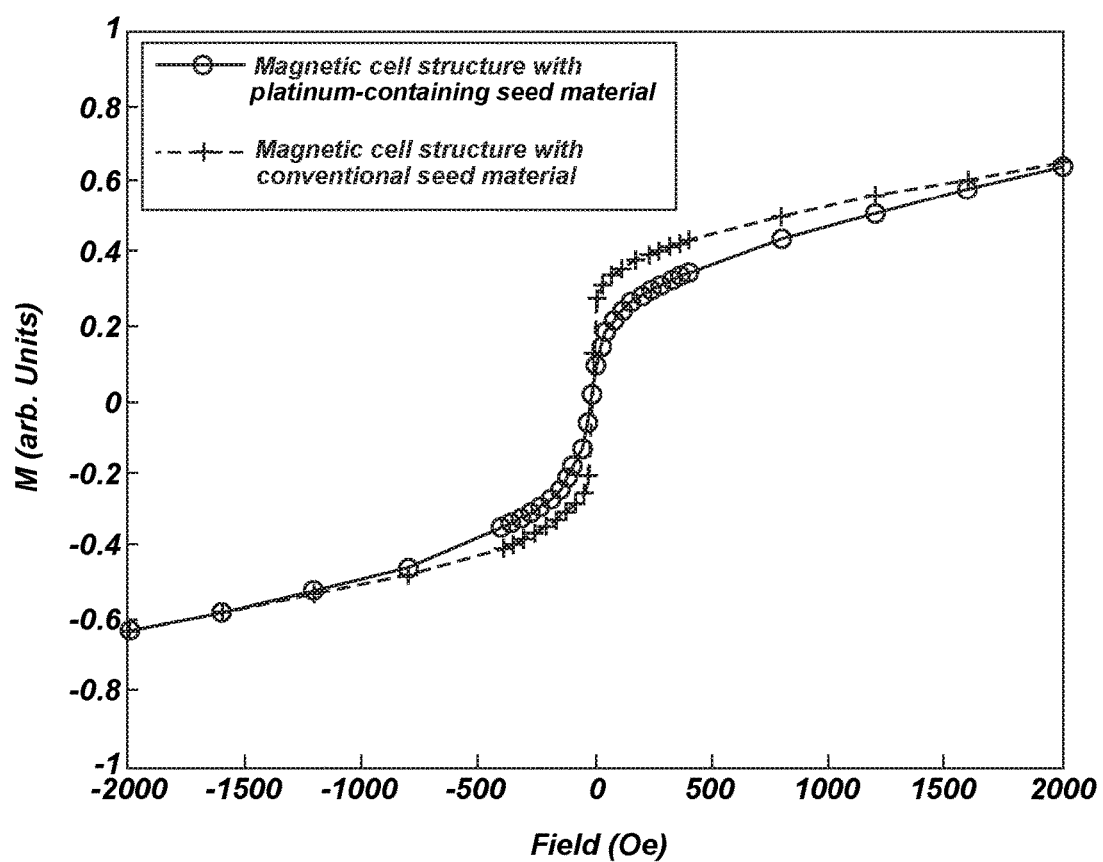
FIG. 8B is an in-plane loop plot comparing the magnetic properties of the magnetic cell structure of FIG. 2 to a magnetic cell structure including a conventional seed material after annealing each of the structures at 300° C. followed by annealing each of the structures at 360° C.

Referring to FIG. 8B, the magnetic cell with the platinum-containing seed material exhibited an improved out-of-plane magnetic field (e.g., PMA) with minimal magnetic degradation. For example, the in-plane loop of the magnetic cell structure including the platinum-containing seed material did not exhibit an in-plane magnetic moment. The magnetic cell structure with the conventional seed material, on the other hand, exhibited magnetic degradation (e.g., a reduced PMA, an increase of in-plane magnetic moment, and degraded switching characteristics) after the anneal at 360° C.

Example 3

Figure 9A:
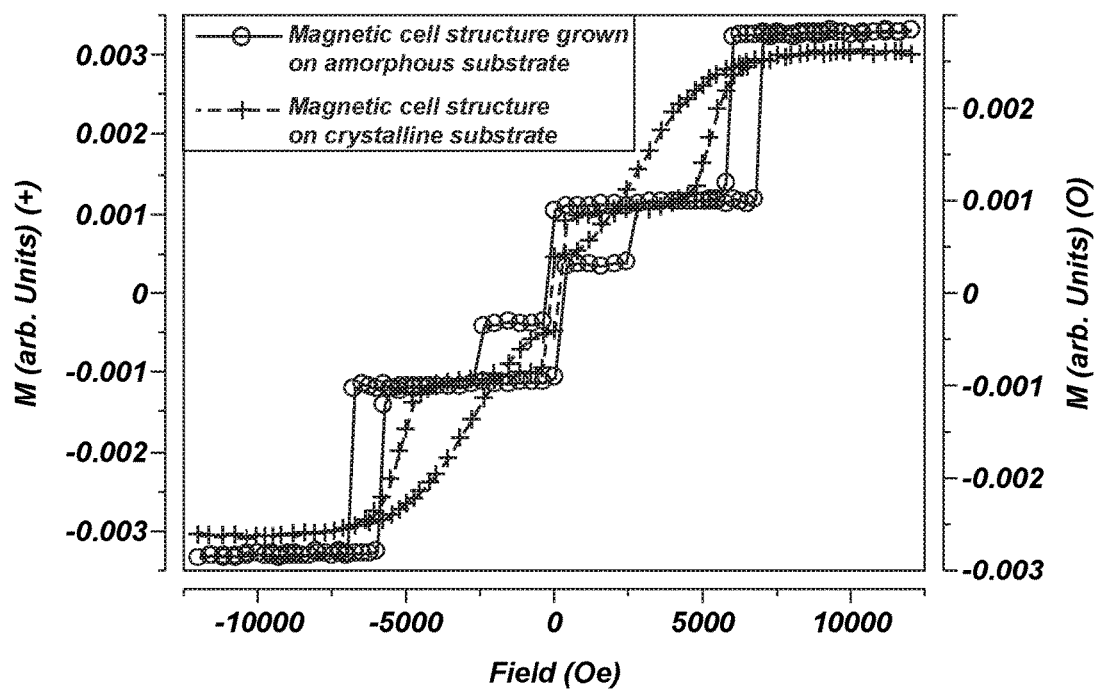
FIG. 9A is an out-of-plane loop plot comparing the magnetic properties of a magnetic cell structure grown over a crystalline substrate to the magnetic properties of a magnetic cell structure grown over an amorphous substrate.

FIG. 9A is a graphical representation showing the out-of-plane magnetic field of magnetic cell structures similar to the magnetic cell structure with the platinum-containing seed material, as described above with reference to FIG. 7. The platinum-containing seed material in one of the magnetic cell structures of FIG. 9A was grown on a crystalline substrate (left scale) and the other magnetic cell structure of FIG. 9A was grown on an amorphous substrate (right scale). The tantalum portion of the seed material of the magnetic cell structure grown on the crystalline substrate was also crystalline. The platinum and the ruthenium formed over the crystalline tantalum exhibited polycrystalline characteristics with crystalline grains having different crystal orientations. Artificial superlattice structures (e.g., Co/Pt artificial superlattice structures of a fixed region) formed over the seed material exhibited a reduction in PMA and a weak antiferromagnetic coupling via a ruthenium coupling material between the artificial superlattice structures. The tantalum portion formed over the amorphous substrate was amorphous. The platinum and ruthenium portions of the seed material exhibited a uniform crystalline structure and the artificial superlattice structures formed over the seed material exhibited a strong PMA and antiferromagnetic coupling to the ruthenium coupling material. As shown in the graph, the magnetic cell structure grown on the amorphous substrate exhibited sharp switching characteristics as compared to the magnetic cell structure grown on the crystalline substrate.

Figure 9B:
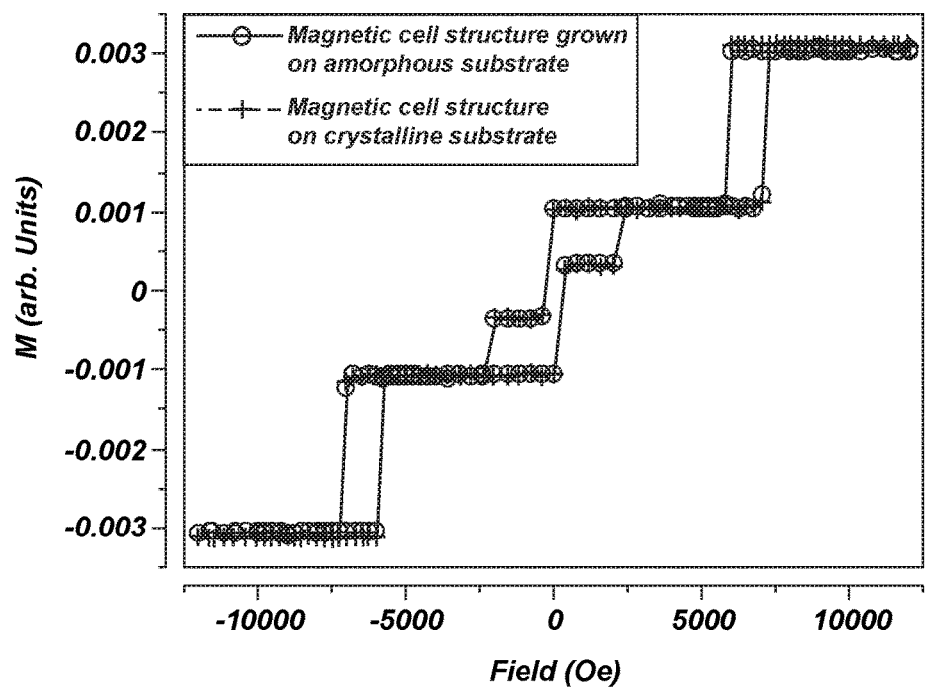
FIG. 9B is an out-of-plane loop plot comparing the magnetic properties of a magnetic cell structure grown over a crystalline substrate to the magnetic properties of a magnetic cell structure grown over an amorphous substrate when each of the magnetic cell structures include an amorphous material between the substrate and the seed material.

Referring to FIG. 9B, a graphical representation showing the out-of-plane magnetic field of a magnetic cell structure grown over an amorphous substrate and another magnetic cell structure grown over a crystalline substrate is shown. Each of the magnetic cell structures included an amorphous material formed between the substrate and the seed material (e.g., the seed material including tantalum, platinum, and ruthenium). The amorphous material over the substrate was approximately 10 Å of a Ni60Cr40 material. An exposed portion of the amorphous material was oxidized. The tantalum portion of the seed material in each of the magnetic cell structures was amorphous and each of the magnetic cell structures exhibited a high PMA and a strong antiferromagnetic coupling between the artificial superlattice structures and the coupling material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:
1. A semiconductor device, comprising:
at least one structure over an electrode, the at least one structure comprising:
an amorphous material comprising nickel oxide, chromium oxide, or a combination thereof over the electrode;
a seed material over the amorphous material, the seed material comprising:
a tantalum material comprising amorphous tantalum over the amorphous material;
a continuous platinum material consisting of platinum over and contacting the tantalum material; and
a ruthenium material over and contacting the continuous platinum material;
a magnetic region over the seed material; and
another magnetic region over the magnetic region; and
another electrode over the another magnetic region.
2. The semiconductor device of claim 1, further comprising an insulating material between the magnetic region and the another magnetic region.
3. The semiconductor device of claim 1, wherein the another magnetic region comprises a first artificial superlattice structure coupled to a second artificial superlattice structure through a coupling material.
4. The semiconductor device of claim 3, wherein the coupling material comprises ruthenium.
5. The semiconductor device of claim 1, wherein the seed material directly overlies and contacts the amorphous material.
6. A semiconductor device, comprising:
an amorphous material comprising tantalum oxide, nickel oxide, chromium oxide, and combinations thereof directly over and contacting an electrode;
a seed material over the amorphous material, the seed material comprising a tantalum material directly over and contacting the amorphous material and separate and distinct from the amorphous material, a continuous platinum material consisting of platinum directly over and contacting the tantalum material, and a ruthenium material directly over and contacting the continuous platinum material;
a first magnetic region over the seed material; and
a second magnetic region over the first magnetic region.
7. The semiconductor device of claim 6, wherein the tantalum material comprises amorphous tantalum.
8. The semiconductor device of claim 6, further comprising an insulative material comprising magnesium oxide, aluminum oxide, or aluminum nitride between the first magnetic region and the second magnetic region.
9. The semiconductor device of claim 6, further comprising a capping material comprising CoFeB over the first magnetic region.
10. The semiconductor device of claim 6, wherein the first magnetic region comprises the same material as the second magnetic region.
11. The semiconductor device of claim 6, wherein the second magnetic region comprises nickel and cobalt.

12. A method of forming a semiconductor device, the method comprising:
forming at least one structure over an electrode, forming the at least one structure comprising:
forming an amorphous material comprising $Ni_{60}Cr_{40}$ over the electrode;
forming a seed material over the amorphous material comprising $Ni_{60}Cr_{40}$, the amorphous material comprising $Ni_{60}Cr_{40}$ between the seed material and the electrode, forming the seed material comprising:
forming an amorphous tantalum material directly over and contacting the amorphous material comprising $Ni_{60}Cr_{40}$;
forming a continuous platinum material consisting of platinum directly over and contacting the tantalum material; and
forming a ruthenium material directly over and contacting the continuous platinum material;
forming a magnetic region over the seed material; and
forming another magnetic region over the magnetic region; and
forming another electrode over the another magnetic region.

13. The method of claim 12, wherein forming an amorphous tantalum material comprises forming the amorphous tantalum material to have a thickness between about 20 Å and about 40 Å.

14. The method of claim 12, wherein forming a magnetic region over the seed material comprises forming an artificial superlattice structure over the seed material, forming a coupling material over the artificial superlattice structure, and forming another artificial superlattice structure over the coupling material.

15. The method of claim 14, wherein forming a coupling material over the artificial superlattice structure comprises forming ruthenium over the artificial superlattice structure.

16. The method of claim 12, wherein forming a seed material comprises forming the seed material over an amorphous substrate.

* * * * *

UNITED STATES PATENT AND TRADEMARK OFFICE
CERTIFICATE OF CORRECTION

PATENT NO.        : 10,134,978 B2
APPLICATION NO.   : 15/667364
DATED             : November 20, 2018
INVENTOR(S)       : Wei Chen et al.

Page 1 of 1

It is certified that error appears in the above-identified patent and that said Letters Patent is hereby corrected as shown below:

In the Specification
Column 7,    Line 66,    change "as the amorphous" to --as the seed--

Signed and Sealed this
First Day of January, 2019

Andrei Iancu
*Director of the United States Patent and Trademark Office*